(12) United States Patent
Sadaka

(10) Patent No.: US 9,391,011 B2
(45) Date of Patent: Jul. 12, 2016

(54) SEMICONDUCTOR STRUCTURES INCLUDING FLUIDIC MICROCHANNELS FOR COOLING AND RELATED METHODS

(71) Applicant: Soitec, Crolles (FR)

(72) Inventor: Mariam Sadaka, Austin, TX (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/642,196

(22) Filed: Mar. 9, 2015

(65) Prior Publication Data

US 2015/0179639 A1 Jun. 25, 2015

Related U.S. Application Data

(62) Division of application No. 13/536,034, filed on Jun. 28, 2012, now Pat. No. 8,980,688.

(51) Int. Cl.
*H01L 21/70* (2006.01)
*H01L 23/498* (2006.01)
*H01L 23/473* (2006.01)
(Continued)

(52) U.S. Cl.
CPC ..... *H01L 23/49827* (2013.01); *B01L 3/502707* (2013.01); *H01L 21/2007* (2013.01); *H01L 23/367* (2013.01); *H01L 23/46* (2013.01); *H01L 23/473* (2013.01); *H01L 23/49822* (2013.01); *H01L 27/0688* (2013.01); *H01L 27/1203* (2013.01); *B01L 2300/0864* (2013.01); *B01L 2300/0867* (2013.01); *B01L 2300/0874* (2013.01); *B01L 2300/0887* (2013.01); *H01L 24/14* (2013.01); *H01L 24/16* (2013.01); *H01L 2224/131* (2013.01); *H01L 2224/13011* (2013.01); *H01L 2224/13025* (2013.01); *H01L 2224/14051* (2013.01); *H01L 2224/14505* (2013.01); *H01L 2224/16145* (2013.01); *H01L 2224/16227* (2013.01); *H01L 2224/17519* (2013.01); *H01L 2224/73204* (2013.01); *H01L 2224/81191* (2013.01); *H01L 2224/81203* (2013.01); *H01L 2224/81815* (2013.01); *H01L 2924/0002* (2013.01)

(58) Field of Classification Search
CPC .................................................. H01L 27/0688
USPC ........................................................ 257/506
See application file for complete search history.

(56) References Cited

U.S. PATENT DOCUMENTS 6,219,237 B1    4/2001   Geusic et al.
6,242,778 B1    6/2001   Marmillion et al.
(Continued)

OTHER PUBLICATIONS

Bakir et al., 3D Heterogeneous Integrated Systems: Liquid Cooling, Power Delivery, and Implementation, IEEE 2008 Custom Integrated Circuits Conference (CICC), Sep. 21-24, 2008, pp. 663-670.
(Continued)

*Primary Examiner* — Anthony Ho
(74) *Attorney, Agent, or Firm* — TraskBritt

(57) ABSTRACT

Semiconductor structures are fabricated that include a semiconductor material bonded to a substrate with a layer of dielectric material between the semiconductor material and the substrate. At least one fluidic microchannel extends in a lateral direction through the layer of dielectric material between the semiconductor material and the substrate. The at least one fluidic microchannel includes at least one laterally extending section having a transverse cross-sectional shape entirely surrounded by the layer of dielectric material.

19 Claims, 18 Drawing Sheets

(51) Int. Cl.
*B01L 3/00* (2006.01)
*H01L 21/20* (2006.01)
*H01L 23/367* (2006.01)
*H01L 23/46* (2006.01)
*H01L 27/06* (2006.01)
*H01L 27/12* (2006.01)
*H01L 23/00* (2006.01)

(56) References Cited

U.S. PATENT DOCUMENTS

| | | |
|---|---|---|
| 6,303,468 B1 | 10/2001 | Aspar et al. |
| 6,335,258 B1 | 1/2002 | Aspar et al. |
| 6,457,515 B1 | 10/2002 | Vafai et al. |
| 6,496,370 B2 | 12/2002 | Geusic et al. |
| 6,756,286 B1 | 6/2004 | Aspar et al. |
| 6,809,044 B1 | 10/2004 | Aspar et al. |
| 6,946,365 B2 | 9/2005 | Aspar et al. |
| 7,056,813 B2 | 6/2006 | Morrow et al. |
| RE39,484 E | 2/2007 | Bruel |
| 7,344,957 B2 | 3/2008 | Barna |
| 7,727,807 B2 | 6/2010 | Han |
| 7,882,624 B2 | 2/2011 | Hu et al. |
| 7,956,381 B1 | 6/2011 | Brewer et al. |
| 8,058,158 B2 | 11/2011 | Bourdelle et al. |
| 8,269,341 B2 | 9/2012 | Barth |
| 8,537,550 B2 | 9/2013 | Higuchi et al. |
| 8,563,365 B2 | 10/2013 | King, Jr. et al. |
| 2004/0251530 A1 | 12/2004 | Yamaji |
| 2005/0085018 A1 | 4/2005 | Kim et al. |
| 2005/0128702 A1 | 6/2005 | Mongia et al. |
| 2006/0002088 A1 | 1/2006 | Bezama et al. |
| 2006/0145356 A1 | 7/2006 | Liu et al. |
| 2007/0128827 A1 | 6/2007 | Faris |
| 2007/0145417 A1 | 6/2007 | Brar et al. |
| 2007/0190695 A1 | 8/2007 | Myers et al. |
| 2007/0267738 A1 | 11/2007 | Chung et al. |
| 2008/0150109 A1 | 6/2008 | Sunohara et al. |
| 2008/0196875 A1 | 8/2008 | Kurtz et al. |
| 2009/0322364 A1 | 12/2009 | Mangrum et al. |
| 2010/0038774 A1 | 2/2010 | Zhang et al. |
| 2010/0072961 A1 | 3/2010 | Kosonocky et al. |
| 2010/0127390 A1 | 5/2010 | Barth |
| 2010/0155888 A1 | 6/2010 | Christo et al. |
| 2010/0155932 A1 | 6/2010 | Gambino et al. |
| 2010/0157526 A1 | 6/2010 | Beaupre et al. |
| 2010/0187682 A1 | 7/2010 | Pinjala et al. |
| 2010/0187683 A1 | 7/2010 | Bakir et al. |
| 2010/0289113 A1 | 11/2010 | Bourdelle et al. |
| 2011/0045611 A1 | 2/2011 | Castex et al. |
| 2011/0170266 A1 | 7/2011 | Haensch et al. |
| 2012/0013012 A1 | 1/2012 | Sadaka et al. |
| 2012/0013013 A1 | 1/2012 | Sadaka et al. |
| 2012/0306088 A1 | 12/2012 | Bartley et al. |
| 2014/0001604 A1 | 1/2014 | Sadaka |
| 2014/0027895 A1 | 1/2014 | Mizuno et al. |
| 2014/0147972 A1 | 5/2014 | Semmelmeyer et al. |

OTHER PUBLICATIONS

Dang, Bing, Integrated Input/Output Interconnection and Packaging for GSI, Georgia Institute of Technology, Dec. 2006, 231 pages.
French Preliminary Search Report and Opinion for French Application No. 1256680 dated Mar. 18, 2013, 7 pages.
French Preliminary Search Report and Opinion for French Application No. 1256683 dated Mar. 21, 2013, 7 pages.
Sekar et al., A 3D-IC Technology with Integrated Microchannel Cooling, Interconnect Technology Conference, 2008, pp. 13-15.
Wei et al., •Optimization Study of Stacked Micro-Channel Heat Sinks for Micro-Electronic Cooling,• Mar. 2003, IEEE Transactions on Components and Packaging Technologies, vol. 26, p. 55-61.

SEMICONDUCTOR STRUCTURES INCLUDING FLUIDIC MICROCHANNELS FOR COOLING AND RELATED METHODS

CROSS-REFERENCE TO RELATED APPLICATIONS

This application is a divisional of U.S. patent application Ser. No. 13/536,034, filed Jun. 28, 2012, now U.S. Pat. No. 8,980,688, issued Mar. 17, 2015, the subject matter of which is related to the subject matter of U.S. patent application Ser. No. 13/536,061, filed Jun. 28, 2012, now U.S. Pat. No. 9,245,836, issued Jan. 26, 2016, the disclosure of each of which is incorporated herein in its entirety by this reference.

TECHNICAL FIELD

The present disclosure relates to methods of forming semiconductor structures that include fluidic microchannels for fluid flow, and to semiconductor structures and devices fabricated using such methods.

BACKGROUND

The three-dimensional (3D) integration of two or more semiconductor structures can produce a number of benefits to microelectronic applications. For example, 3D integration of microelectronic components can result in improved electrical performance and power consumption while reducing the area of the device footprint. See, for example, P. Garrou, et al. "The Handbook of 3D Integration," Wiley-VCH (2008).

The 3D integration of semiconductor structures may take place by the attachment of a semiconductor die to one or more additional semiconductor dice (i.e., die-to-die (D2D)), a semiconductor die to one or more semiconductor wafers (i.e., die-to-wafer (D2W)), as well as a semiconductor wafer to one or more additional semiconductor wafers (i.e., wafer-to-wafer (W2W)), or a combination thereof.

As semiconductor structures are integrated in a 3D configuration, however, the removal of heat from the integrated structures becomes problematic. The density of heat generating devices may be increased in 3D integration processes, without a proportional increase in heat-dissipating outer surface area. The additional heat generated needs to be removed from the 3D integrated structures to prevent failure of the operational devices therein resulting from excessive temperatures.

It has been proposed to incorporate fluid channels having microscale dimensions or smaller (hereinafter referred to as "fluidic microchannels") into 3D integrated semiconductor structures to allow fluid to flow through the fluidic microchannels during operation of the devices in the 3D integrated semiconductor structures for removal of heat. See, for example, D. Sekar, A 3D-IC Technology with Integrated Microchannel Cooling, IEEE 2008, (Georgia Tech).

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes methods of fabricating semiconductor structures. In accordance with such methods, at least one laterally extending recess is formed in at least one of a first dielectric material on a substrate and a second dielectric material on a semiconductor material. The semiconductor material is bonded to the substrate by establishing dielectric-to-dielectric molecular bonds directly between the first dielectric material on the substrate and the second dielectric material on the semiconductor material and defining at least one fluidic microchannel between the first dielectric material and the second dielectric material at an interface between the first dielectric material and the second dielectric material. The at least one fluidic microchannel is formed so as to be at least partially defined by the at least one laterally extending recess and to include at least one laterally extending section having a transverse cross-sectional shape entirely surrounded by the first dielectric material and the second dielectric material.

In additional embodiments, the present disclosure includes semiconductor structures that comprise a semiconductor material bonded to a substrate with a layer of dielectric material between the semiconductor material and the substrate. At least one fluidic microchannel extends in a lateral direction through the layer of dielectric material between the semiconductor material and the substrate. The at least one fluidic microchannel includes at least one laterally extending section having a transverse cross-sectional shape entirely surrounded by the layer of dielectric material.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

FIG. 5 is a simplified cross-sectional view illustrating a donor structure comprising bulk semiconductor material;

FIG. 6 illustrates a dielectric material on a surface of the donor structure of FIG. 5;

FIG. 7 illustrates the dielectric material on the surface of the donor structure abutting the dielectric material of the structure of FIG. 3;

FIG. 8 illustrates the dielectric material between the donor structure and the substrate of the structure of FIG. 3 after a bonding process used to establish a direct molecular bond between the dielectric material on the surface of the donor structure and the dielectric material of the structure of FIG. 3;

Figure 3:
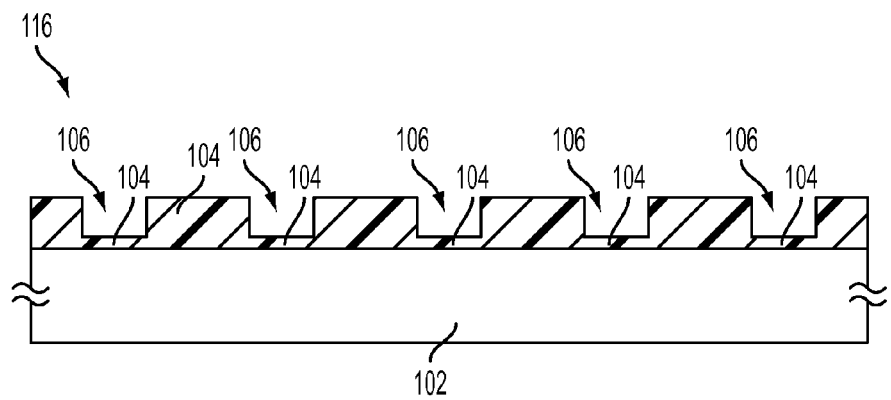
FIG. 3 illustrates additional dielectric material provided on the structure of FIG. 2.
Figure 4:
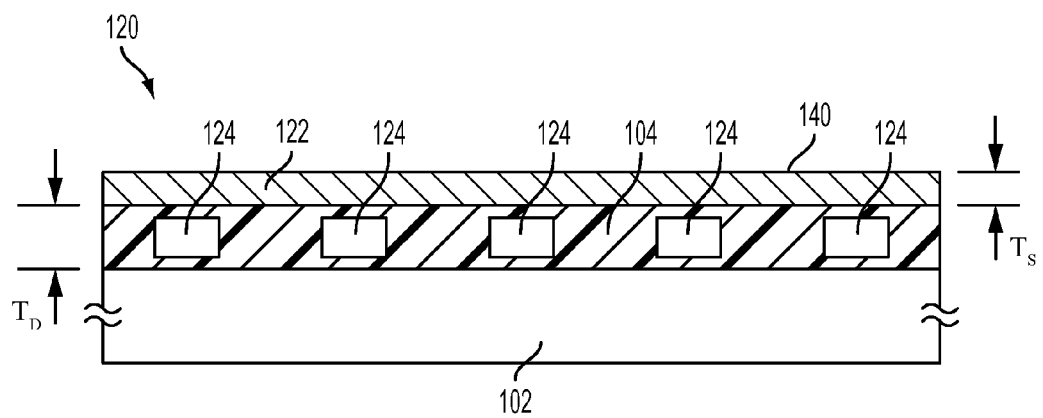
FIG. 4 illustrates a layer of semiconductor material bonded over the structure of FIG. 3 with dielectric material between the layer of semiconductor material and the substrate, and fluidic microchannels extending through the dielectric material.
Figure 9:
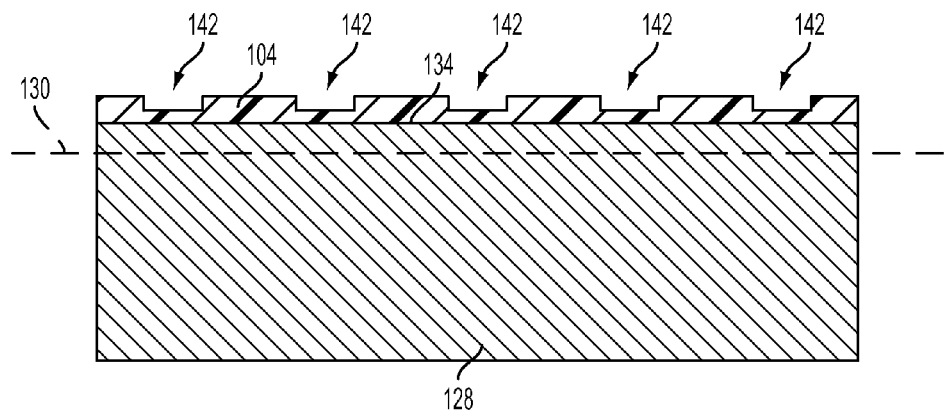
FIGS. 9 and 10 illustrate another method that may be used to provide the layer of semiconductor material shown in FIG.
Figure 10:
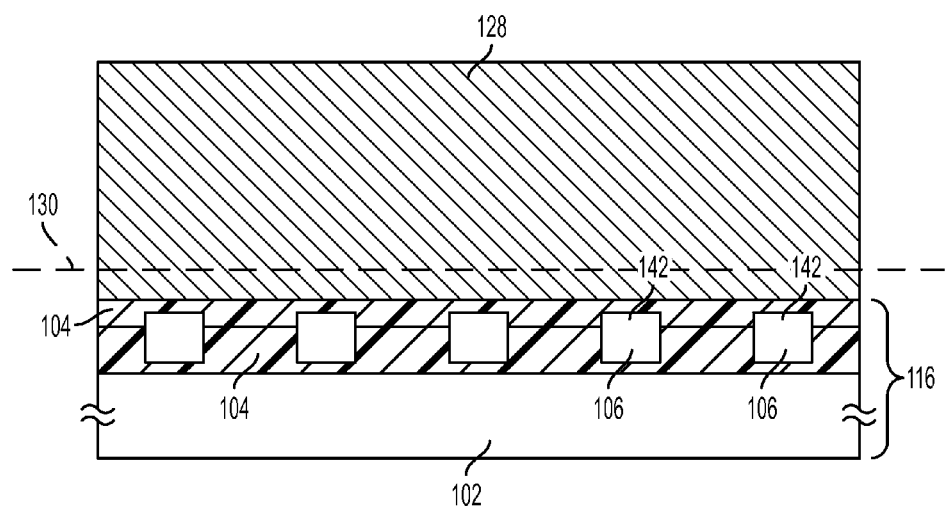

4 over the structure of FIG. 3, wherein portions of fluidic microchannels are also formed in a dielectric material on a donor structure;

FIG. 9 is a simplified cross-sectional view illustrating a dielectric material on a surface of a donor structure with laterally extending recesses formed in the dielectric material;

FIG. 10 illustrates the dielectric material on the surface of the donor structure as shown in FIG. 9 abutting the dielectric material of the structure of FIG. 3;

FIGS. 11 through 15 illustrate additional methods of the present disclosure in which fluidic microchannels are formed at least partially within the layer of semiconductor material in the structure shown in FIG. 4.

Figure 11:
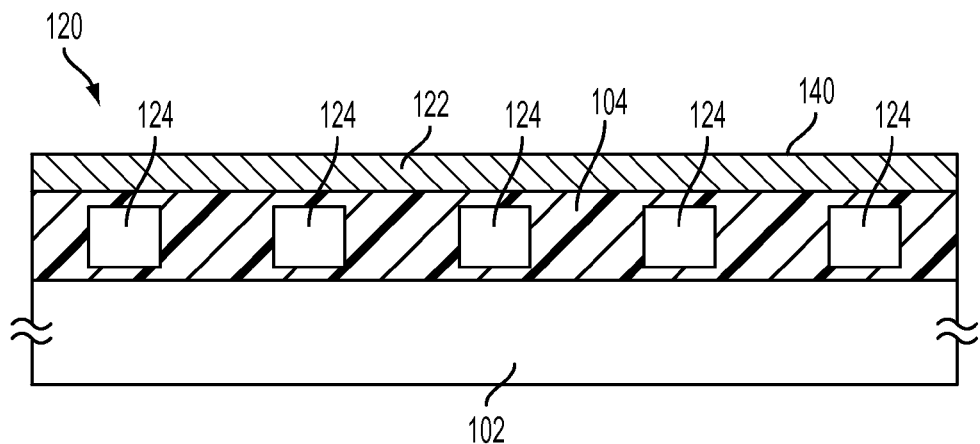
Figure 12:
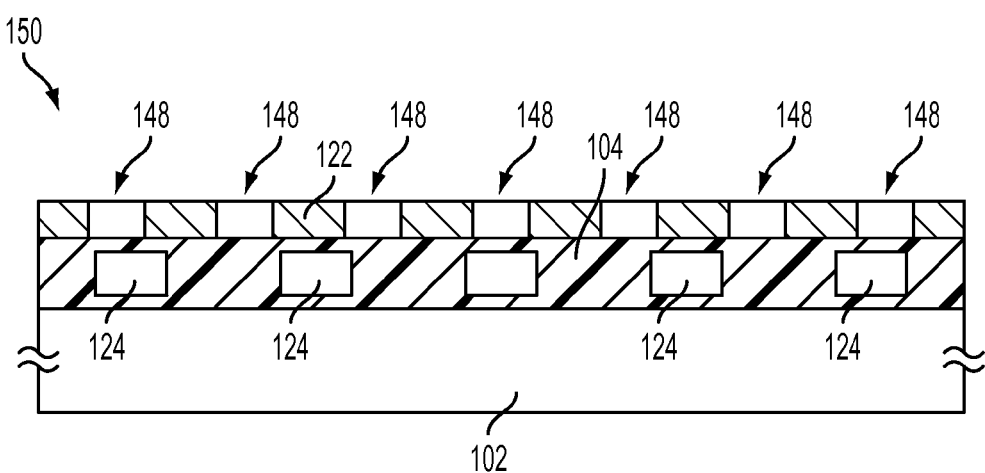
Figure 13:
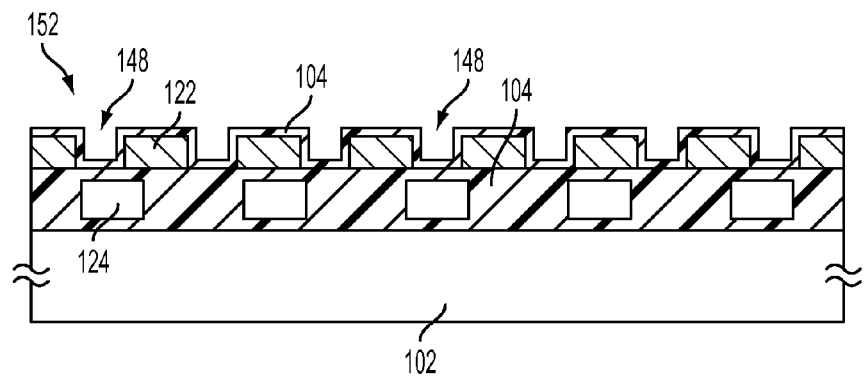
Figure 14:
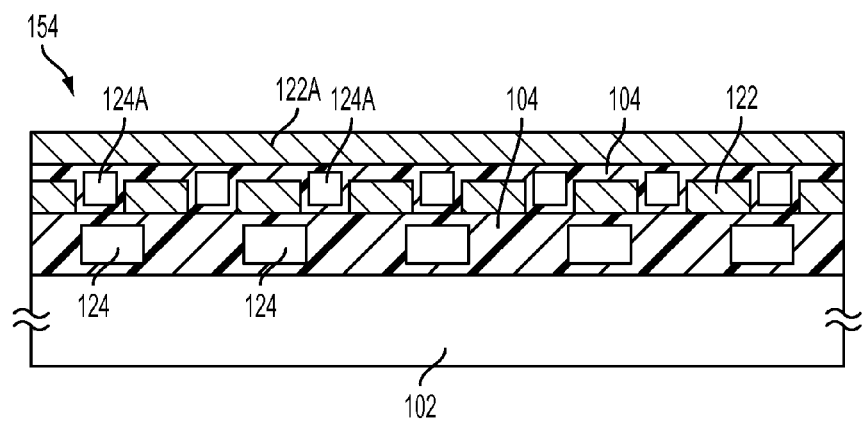
Figure 15:
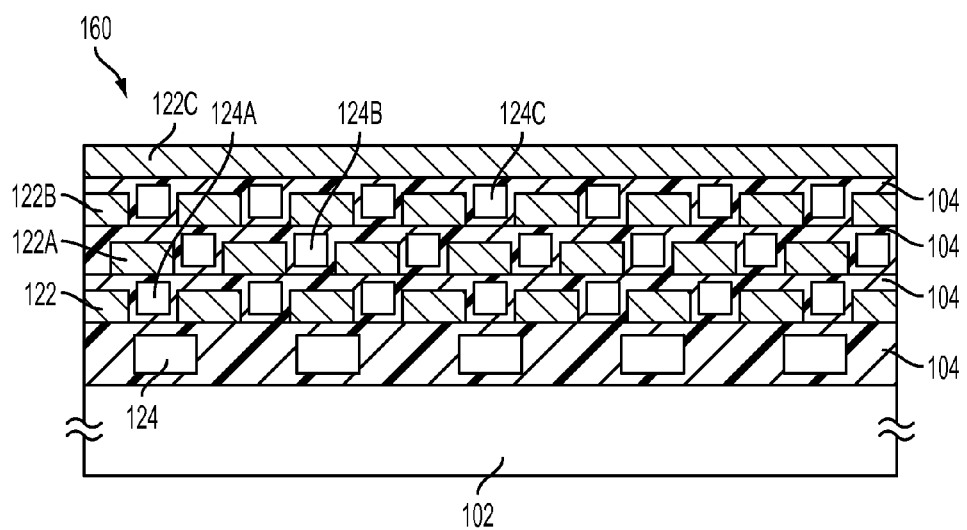
Figure 16:
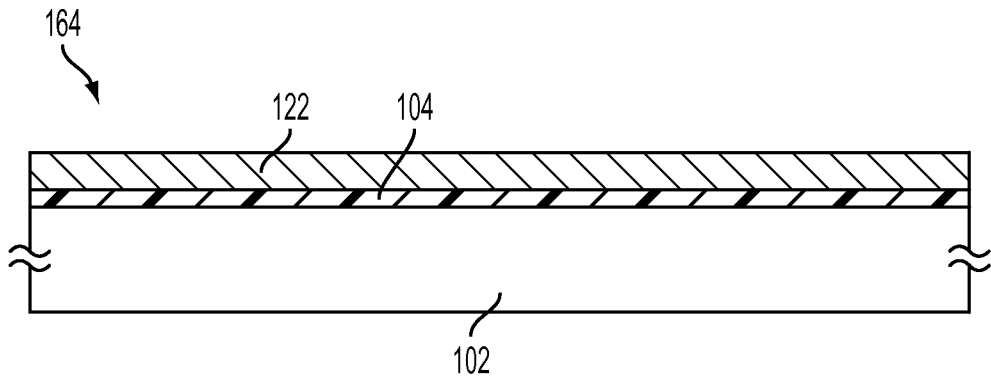
Figure 17:
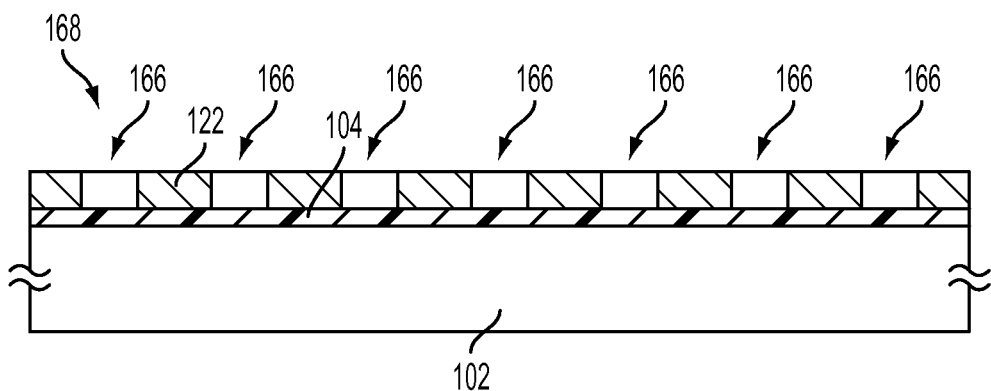
Figure 18:
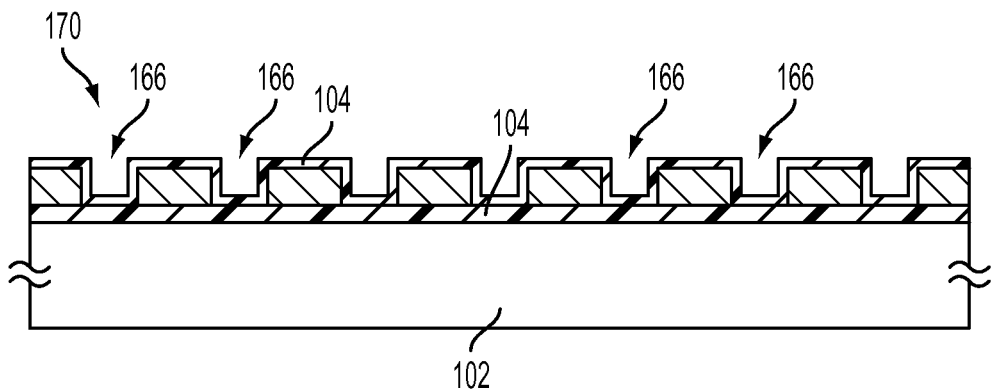
Figure 19:
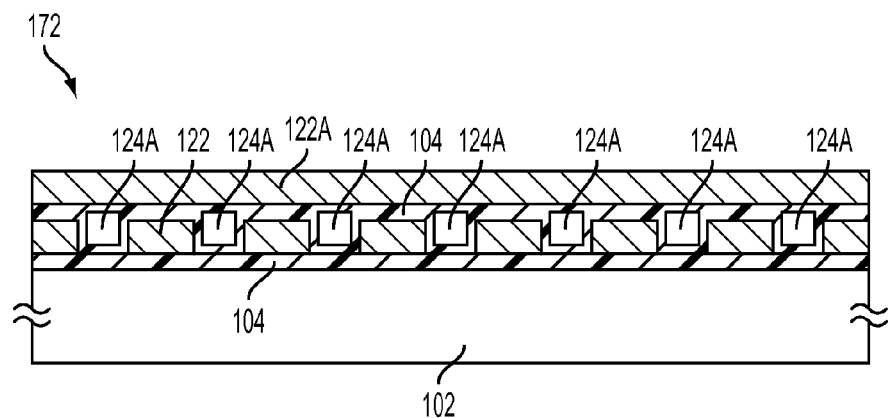
Figure 20:
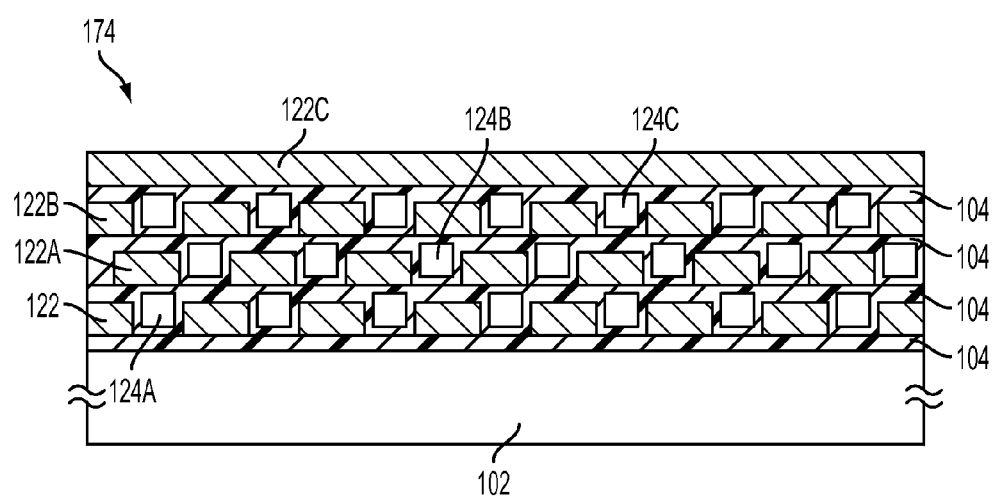
Figure 21:
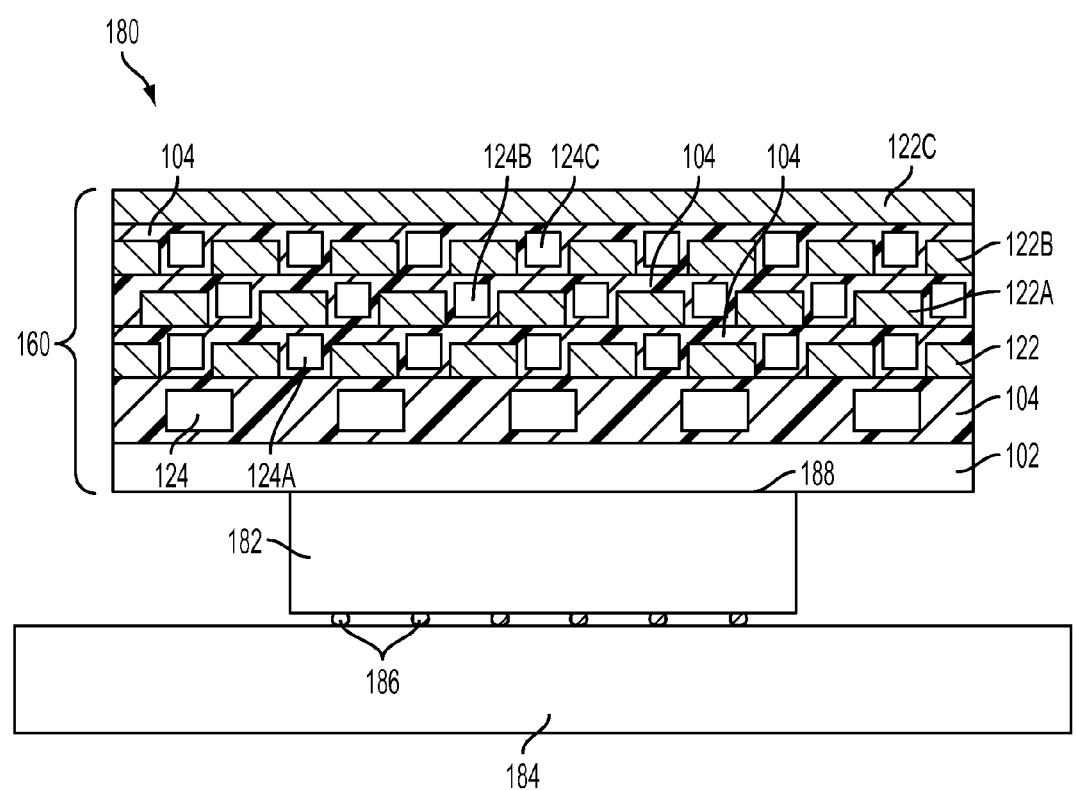
Figure 22:
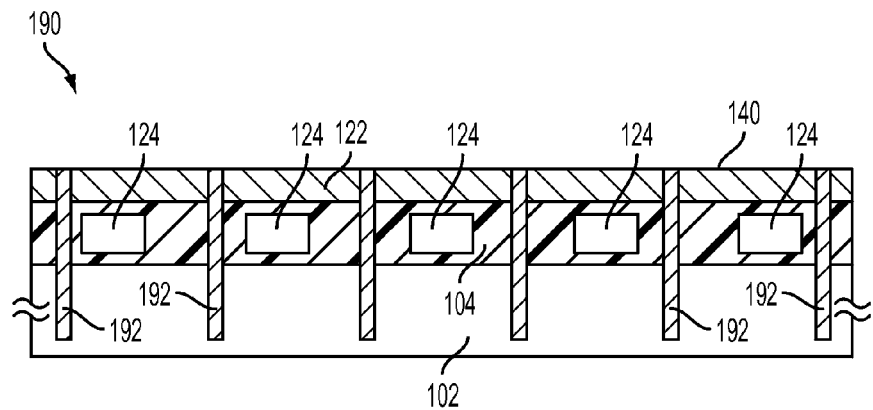
Figure 23:
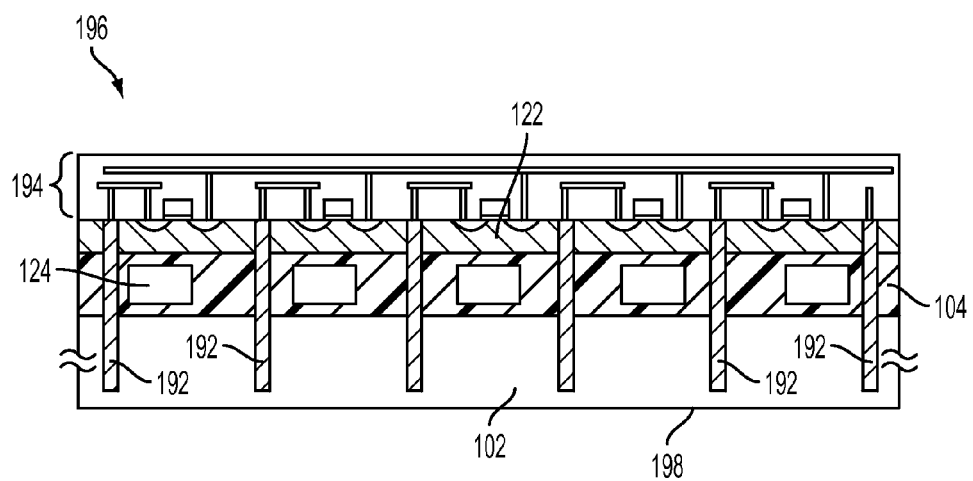
Figure 24:
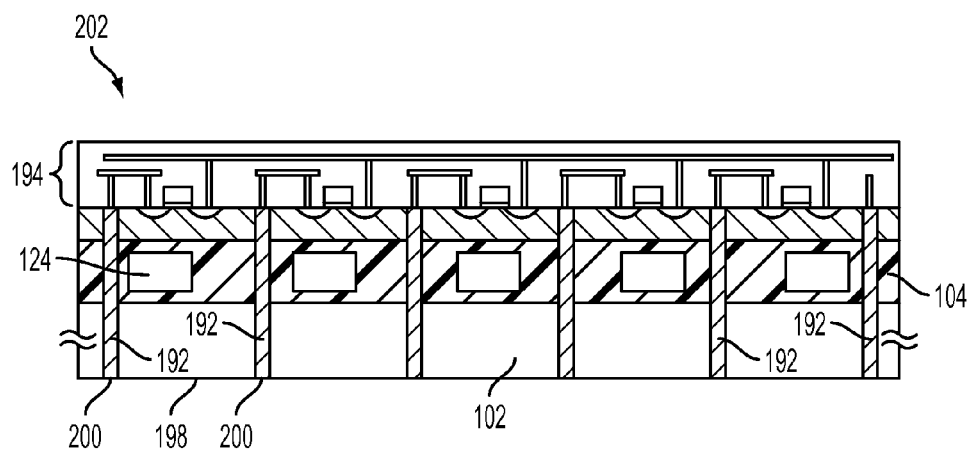
Figure 25:
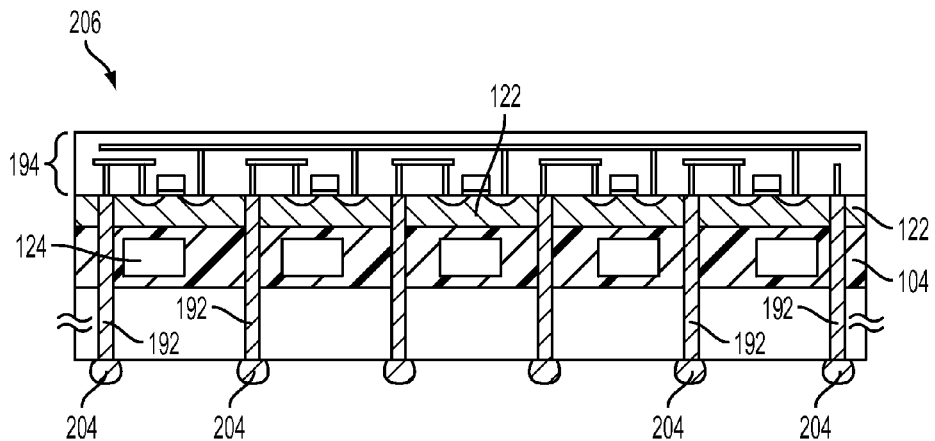
Figure 26:
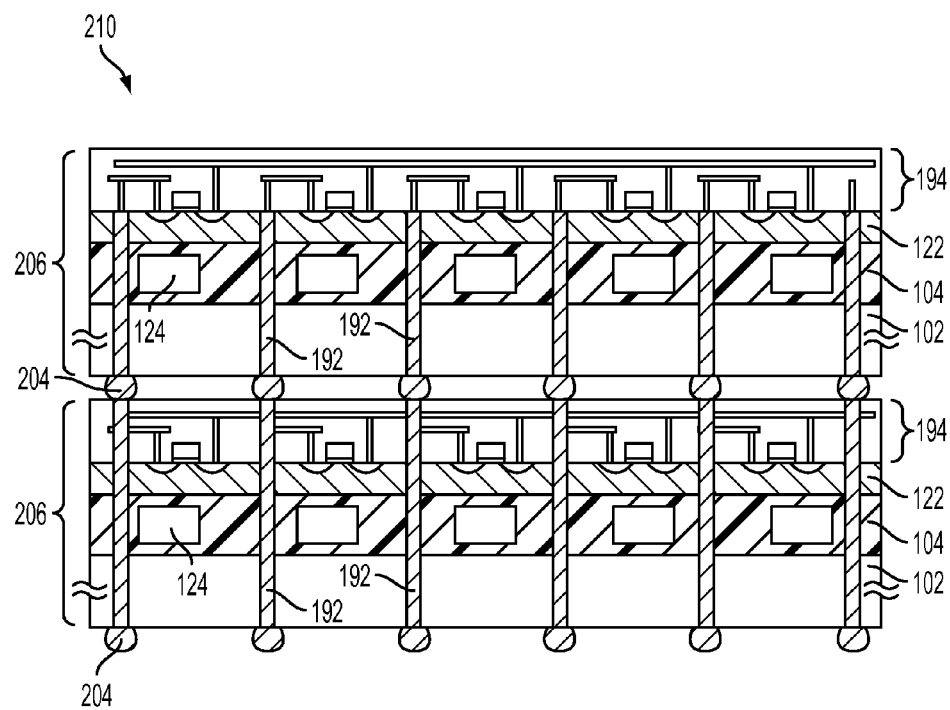
Figure 27:
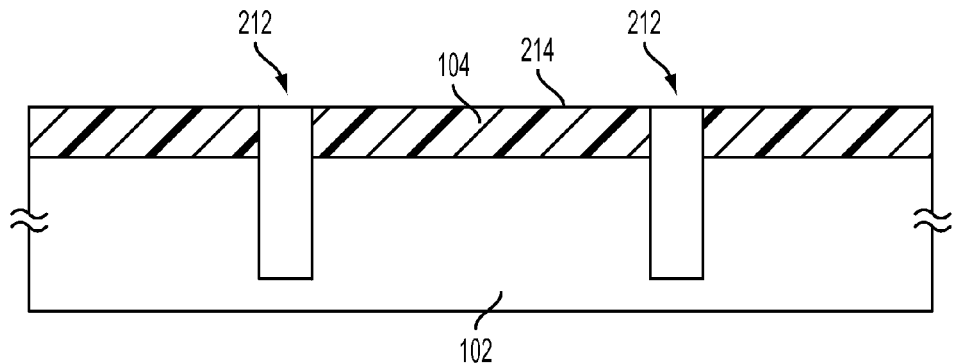
Figure 28:
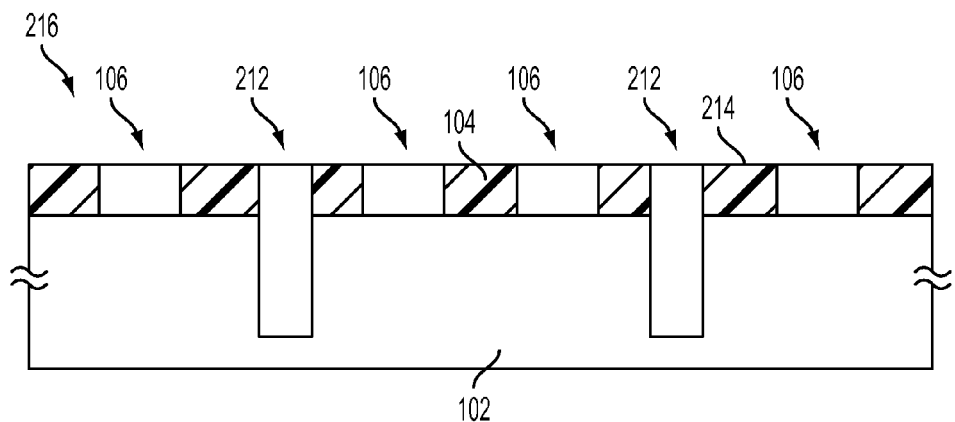
Figure 29:
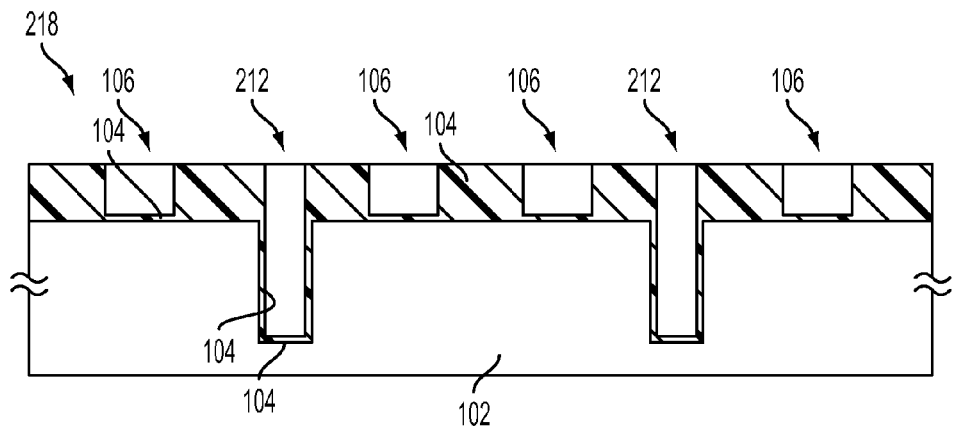
Figure 30:
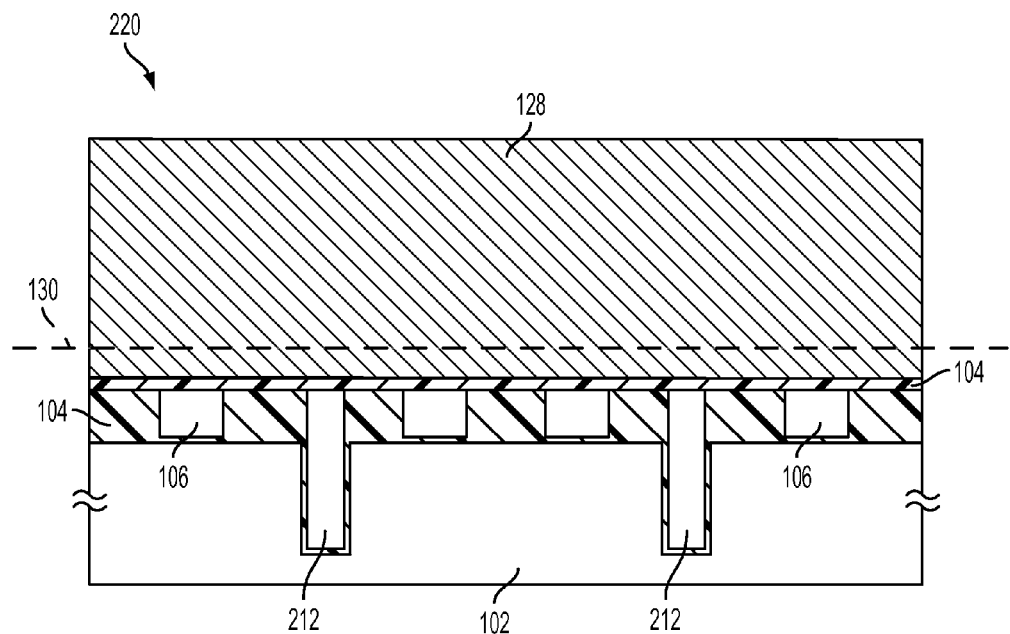
Figure 31:
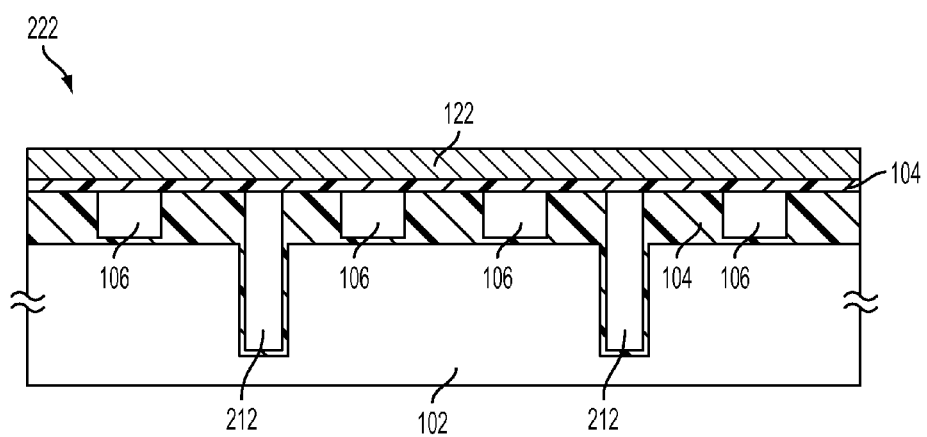
Figure 32:
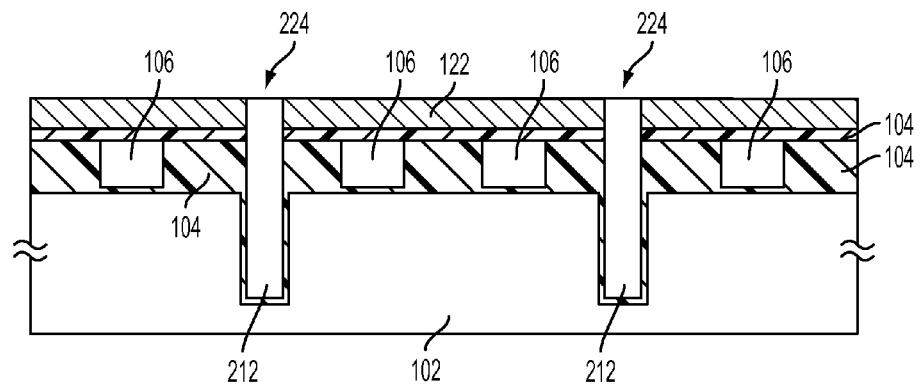
Figure 33:
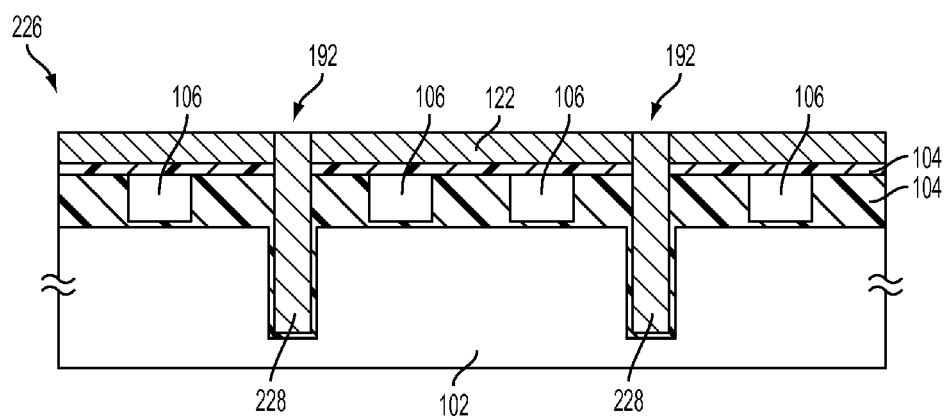
Figure 34:
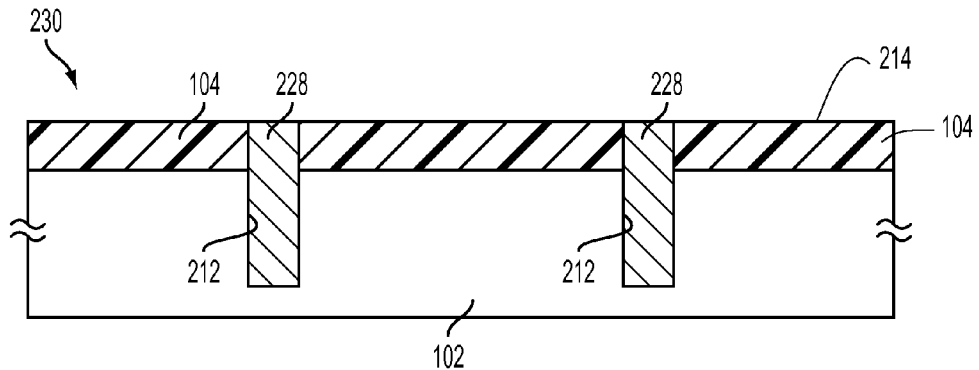
Figure 35:
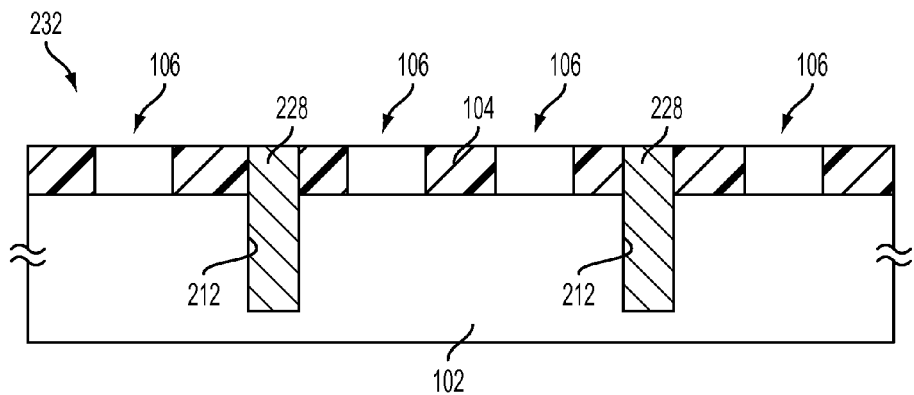
Figure 36:
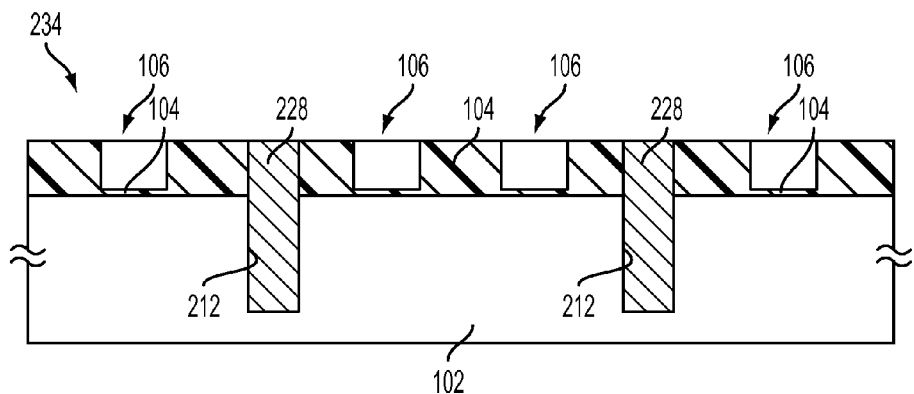
Figure 37:
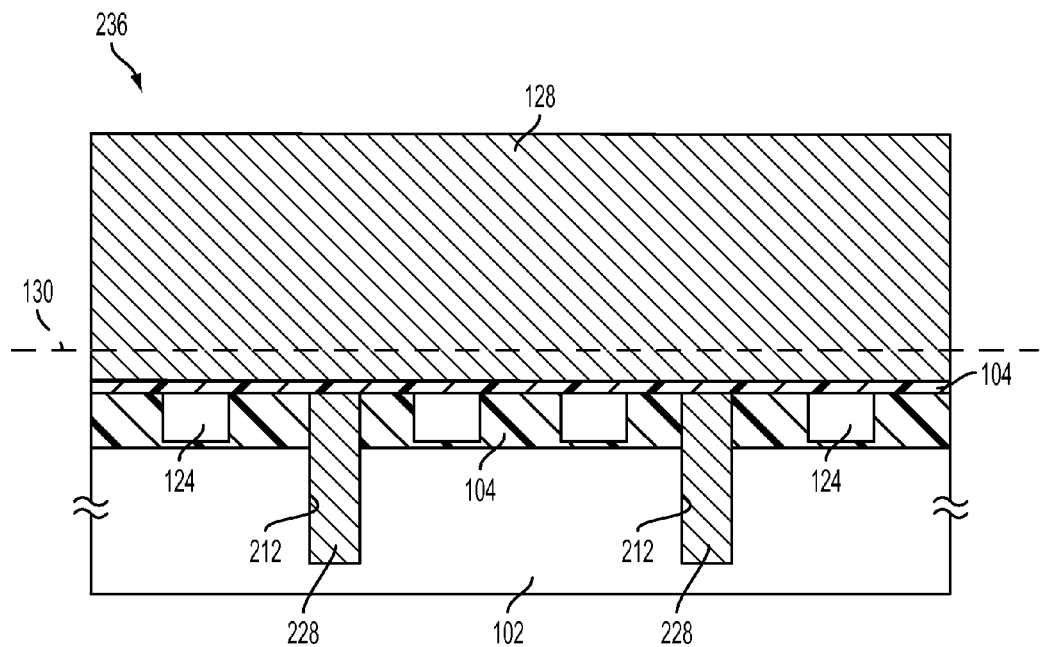
Figure 38:
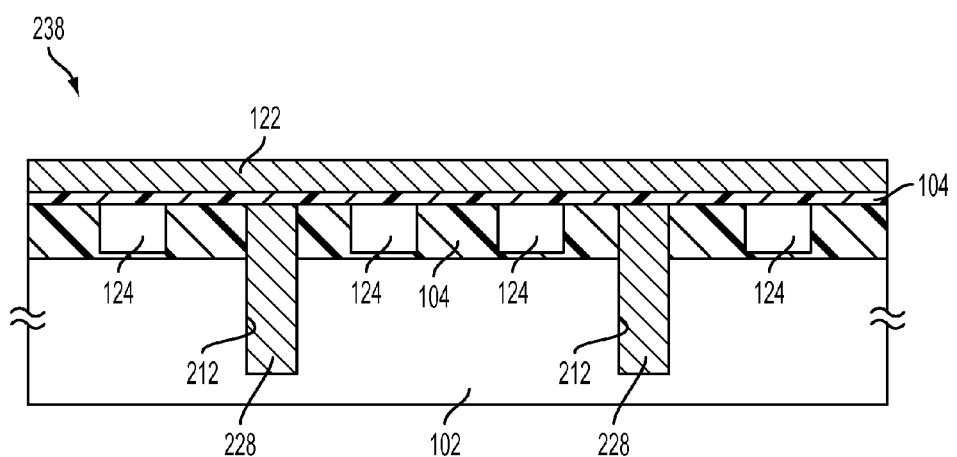
Figure 39:
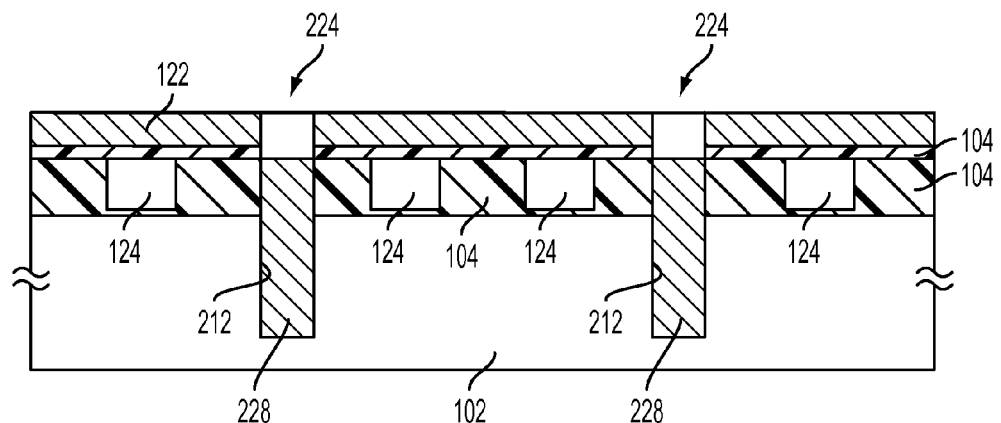
Figure 40:
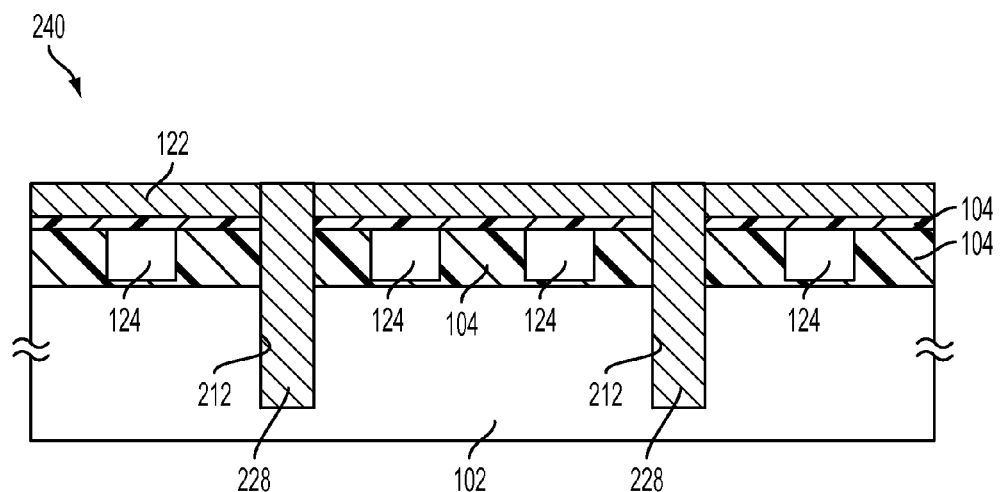

FIG. 11 is a simplified cross-sectional view like that of FIG. 4 and illustrates a layer of semiconductor material bonded over a substrate with dielectric material between the layer of semiconductor material and the substrate, and fluidic microchannels extending through the dielectric material;

FIG. 12 illustrates apertures formed through the layer of semiconductor material;

FIG. 13 illustrates a dielectric material provided over the layer of semiconductor material and within the recesses formed in the layer of semiconductor material;

FIG. 14 illustrates another layer of semiconductor material bonded over the structure of FIG. 13 in a manner forming fluidic microchannels extending through a dielectric material between the additional layer of semiconductor material and the first layer of semiconductor material, the fluidic microchannels at least partially disposed within the apertures formed through the first layer of semiconductor material;

FIG. 15 illustrates another semiconductor structure that may be fabricated by repeating the processes described with reference to FIGS. 12 through 14 on the structure of FIG. 14 two additional times to form two additional layers of fluidic microchannels over the structure of FIG. 14;

FIGS. 16 through 20 illustrate additional methods of the present disclosure in which fluidic microchannels are formed at least partially within a layer of semiconductor material provided over a substrate without first forming any fluidic microchannels in a dielectric material between the layer of semiconductor material and the substrate;

FIG. 16 is a simplified cross-sectional view of a layer of semiconductor material bonded over a substrate with a solid and continuous layer of dielectric material between the layer of semiconductor material and the substrate;

FIG. 17 illustrates apertures formed through the layer of semiconductor material of FIG. 16;

FIG. 18 illustrates a dielectric material provided on the layer of semiconductor material and within the apertures formed therein;

FIG. 19 illustrates another layer of semiconductor material bonded over the structure of FIG. 18 in a manner forming fluidic microchannels extending through a dielectric material between the additional layer of semiconductor material and the first layer of semiconductor material, the fluidic microchannels at least partially disposed within the apertures formed through the first layer of semiconductor material;

FIG. 20 illustrates another semiconductor structure that may be fabricated by repeating the processes described with reference to FIGS. 17 through 19 on the structure of FIG. 19 two additional times to form two additional layers of fluidic microchannels over the structure of FIG. 19;

FIG. 21 illustrates another semiconductor structure that may be fabricated by bonding a structure including fluidic microchannels as described herein, such as the structure of any one of FIGS. 4, 15, and 20, over an active semiconductor device and utilizing the structure including the fluidic microchannels as a heat sink to cool the active semiconductor structure;

FIG. 22 illustrates electrically conductive vias formed through the semiconductor material, the dielectric material, and partially through the substrate shown in FIG. 4;

FIG. 23 illustrates active device structures formed in and over the layer of semiconductor material as shown in FIG. 22;

FIG. 24 illustrates the structure of FIG. 23 after thinning the substrate and exposing the electrically conductive vias on a side of the substrate opposite the active device structures;

FIG. 25 illustrates electrically conductive contact structures formed over the exposed ends of the electrically conductive vias shown in FIG. 24;

FIG. 26 illustrates a bonded semiconductor structure fabricated by bonding two semiconductor structures similar to that shown in FIG. 25 vertically over one another and establishing electrical contact between the two semiconductor structures;

FIGS. 27 through 33 illustrate methods that may be used to fabricate a structure like that shown in FIG. 22;

FIG. 27 is a simplified cross-sectional view illustrating a dielectric material over a substrate with apertures formed through the dielectric material and holes for conductive vias formed through the dielectric material and partially through the substrate;

FIG. 28 illustrates laterally extending recesses for forming fluidic microchannels formed in the layer of dielectric material of the structure of FIG. 27;

FIG. 29 illustrates dielectric material provided over the structure of FIG. 29 including within the recesses and the holes;

FIG. 30 illustrates a donor structure bonded to the structure of FIG. 29;

FIG. 31 illustrates a layer of semiconductor material bonded over the substrate and transferred from the donor structure shown in FIG. 30;

FIG. 32 illustrates holes formed through the transferred layer of semiconductor material so as to extend the holes extending through the dielectric material and the substrate through the layer of semiconductor material;

FIG. 33 illustrates an electrically conductive material within the holes extending through the structure of FIG. 32;

FIGS. 34 through 40 illustrate additional methods that may be used to fabricate a structure like that shown in FIG. 22;

FIG. 34 is a simplified cross-sectional view illustrating a dielectric material over a substrate with conductive vias formed through the dielectric material and partially through the substrate;

FIG. 35 illustrates recesses for forming fluidic microchannels faulted through the dielectric material of the structure of FIG. 34;

FIG. 36 illustrates dielectric material provided over the structure of FIG. 35 including within the apertures;

FIG. 37 illustrates a donor structure bonded to the structure of FIG. 36;

FIG. 38 illustrates a layer of semiconductor material bonded over the substrate and transferred from the donor structure shown in FIG. 37;

FIG. 39 illustrates holes formed through the transferred layer of semiconductor material over the conductive vias extending through the dielectric material and partially through the substrate; and FIG. 40 illustrates additional electrically conductive material within the holes extending through the layer of semiconductor material in the structure of FIG. 39 so as to extend the conductive vias through the layer of semiconductor material.

DETAILED DESCRIPTION

The illustrations presented herein are not meant to be actual views of any particular semiconductor material, structure, or device, but are merely idealized representations that are used to describe embodiments of the disclosure.

Any headings used herein should not be considered to limit the scope of embodiments of the invention as defined by the claims below and their legal equivalents. Concepts described in any specific heading are generally applicable in other sections throughout the entire specification.

A number of references are cited herein, the entire disclosures of which are incorporated herein in their entirety by this reference for all purposes. Further, none of the cited references, regardless of how characterized herein, is admitted as prior art relative to the invention of the subject matter claimed herein.

The present disclosure includes methods of fabricating semiconductor structures that include one or more fluidic microchannels for use in cooling active semiconductor devices carried by or bonded to the semiconductor structures. The methods may employ what are referred to in the art as semiconductor-on-insulator (SOI) structures. Such methods are disclosed below with reference to the figures.

Figure 1:
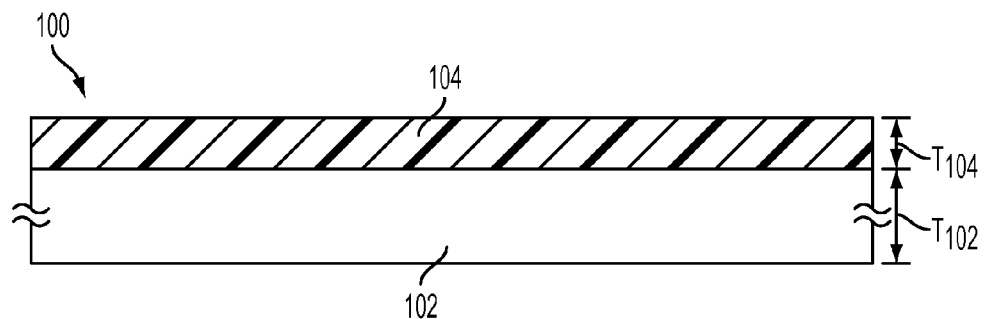
FIG. 1 is a simplified cross-sectional view illustrating a dielectric material on a substrate.

FIG. 1 illustrates a structure 100 that includes a substrate 102 and a dielectric material 104 on the substrate. The substrate 102 may comprise what is referred to in the art as a "die" or a "wafer," and may be generally planar. The substrate 102 may comprise any of a number of materials conventionally used for such substrates, such as oxides (e.g., aluminum oxide, zirconium oxide, silicon oxide, etc.) and semiconductor materials (e.g., silicon, germanium, silicon carbide, a III-V semiconductor material, aluminum nitride, diamond etc.). The substrate 102 may comprise a glass in some embodiments. In other embodiments, the substrate 102 may comprise a crystalline material (e.g., polycrystalline or monocrystalline material). Further, the substrate 102 may be at least substantially comprised by a single, generally homogenous material, or the substrate 102 may comprise a multi-layer structure. The dielectric material 104 may comprise an electrically insulating material, such as an oxide (e.g., silicon oxide, aluminum oxide, zirconium oxide, etc.), a nitride (e.g., silicon nitride), or an oxynitride (e.g., silicon oxynitride). The dielectric material 104 may comprise a layer of the dielectric material 104 that is disposed on a major, planar surface of the generally planar substrate 102, as shown in FIG. 1.

The figures are not to scale, and the layer of dielectric material 104 may be relatively thin when compared to a thickness of the substrate 102. By way of example and not limitation, the substrate 102 may have an average layer thickness $T_{102}$ of about two hundred microns (200 µm) or more, about five hundred microns (500 µm) or more, or even about seven hundred and fifty microns (750 µm) or more, whereas the layer of dielectric material 104 may have an average layer thickness $T_{104}$ of about five hundred microns (500 µm) or less, or even about four hundred microns (400 µm) or less (e.g., between about one tenth of one micron (0.1 µm) and about five hundred microns (500 µm), or even between about two hundred microns (200 µm) and about four hundred (400 µm) microns).

Figure 2A:
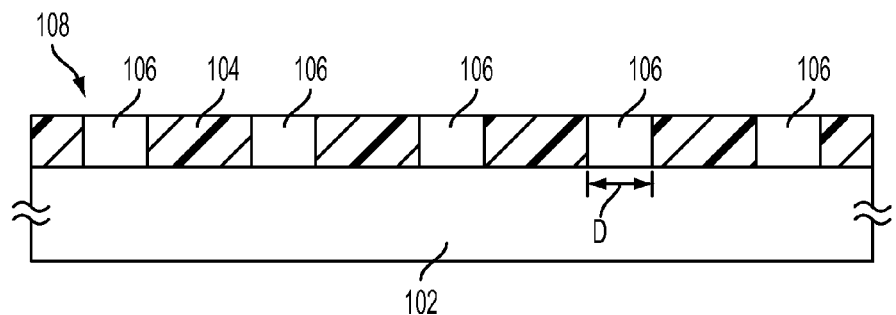
FIG. 2A illustrates apertures formed through the dielectric material of FIG. 1.
Figure 2B:
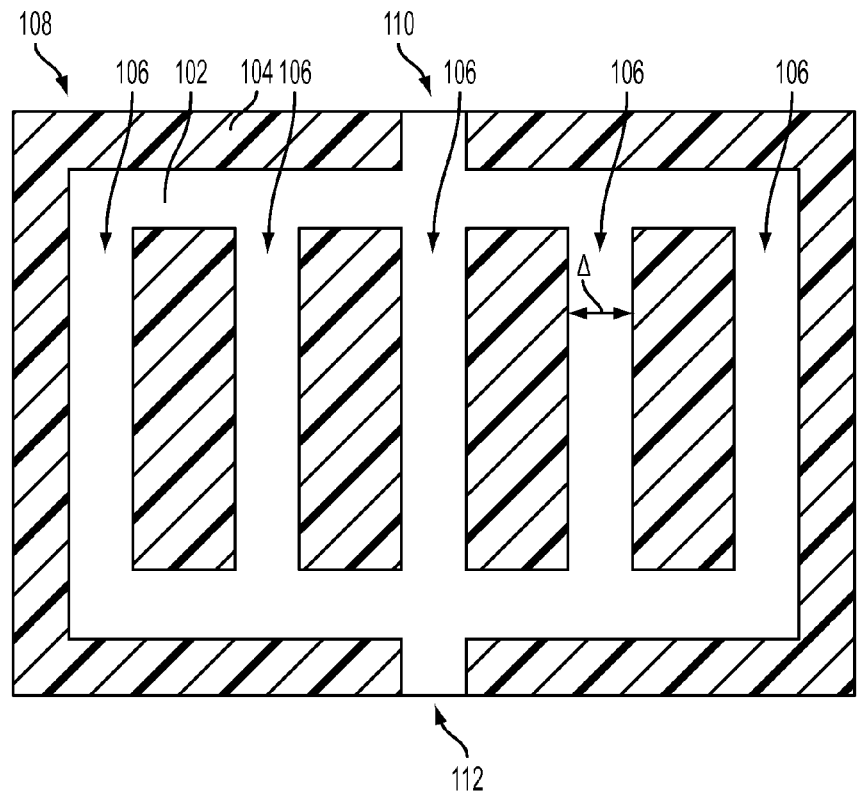
FIG. 2B is a plan view of the semiconductor structure of FIG. 2A.

Referring to FIGS. 2A and 2B, one or more laterally extending recesses 106 may be formed in the dielectric material 104 on the substrate 102 to form the structure 108 shown therein. The recesses 106 are used to form fluidic microchannels. The laterally extending recesses 106 may comprise apertures that extend entirely through the dielectric material 104 to the underlying substrate 102 in some embodiments. The recesses 106 may have an average transverse cross-sectional dimension D of between about one tenth of a micron (0.1 µm) and about seven hundred microns (700 µm), between about ten microns (10 µm) and about five hundred microns (500 µm), or between about one hundred microns (100 µm) and about four hundred microns (400 µm).

The recesses 106 may be interconnected with one another so as to form an interconnected network of recesses, which may communicate with a fluid inlet port 110 and a fluid outlet port 112 on lateral sides of the semiconductor structure 108. In this configuration, upon completion of fabrication of the semiconductor structure 108, a cooling fluid (e.g., a gas, a liquid, or both a gas and a liquid) may be caused to flow into the semiconductor structure 108 through the inlet port 110, through fluidic microchannels comprising the recesses 106, and out the outlet port 112 to remove heat from the semiconductor structure 108. Other configurations and layouts for the recesses 106 and resulting fluidic microchannels may be employed, and the configuration shown in FIGS. 2A and 2B is provided merely as a non-limiting example. Further, although the embodiment of FIGS. 2A and 2B includes only a single fluid inlet port 110 and a single fluid outlet port 112, other embodiments may include two or more inlet ports 110 and two or more outlet ports 112. The configuration of the recesses 106 and resulting fluidic microchannels (including their layout design and size) may be selected to optimize mass transport of a cooling fluid during operation, and, hence, heat exchange between the cooling fluid and the semiconductor structure 108.

The recesses 106 may be formed in the dielectric material 104 using, for example, a photolithographic masking and etching process. In such embodiments, a mask layer may be deposited over the surface of the dielectric material 104 and selectively patterned so as to form apertures through the mask layer at the locations at which it is desired to etch into the dielectric material to form the recesses 106. After forming the patterned mask layer, the regions of the dielectric material 104 that are exposed through the patterned mask layer may be etched using, for example, a wet etching process or a dry reactive ion etching process to foam the recesses 106 in the dielectric material 104. Although the recesses 106 are shown in FIGS. 2A and 2B as having a rectangular cross-sectional shape, the recesses 106 may have any cross-sectional shape, and the cross-sectional shape may be at least partially a function of the type of etching process (e.g., isotropic or anisotropic) used to form the recesses 106. After the etching process, the patterned mask layer may be removed.

Referring to FIG. 3, additional dielectric material 104 may be provided over the semiconductor structure 108 of FIGS. 2A and 2B, including within the recesses 106 so as to cover the exposed surface of the substrate 102 within the recesses 106 with dielectric material 104 and form the structure 116 of FIG. 3. In other words, the recesses 106 may be lined with dielectric material 104. This may prevent oxidation or other alteration of the surfaces within the recesses 106 and resulting fluidic microchannels when cooling fluid is caused to flow through the fluidic microchannels during operation. In some embodiments, the additional dielectric material 104 may be similar or identical in composition to the dielectric material 104 first provided on the substrate 102. The additional dielectric material 104 may be formed, in some embodiments, by oxidizing exposed surfaces of the substrate 102. For example, if the substrate 102 comprises silicon, the exposed surfaces of the substrate 102 may be oxidized to form silicon oxide. In other embodiments, the additional dielectric material 104 may be deposited using, for example, a chemical vapor deposition (CVD) process. In additional embodiments, the structure 116 of FIG. 3 may be formed by selectively etching entirely through the dielectric material 104 and stopping on the substrate 102, or by etching only partially through the dielectric material 104 when forming the recesses 106, so as to avoid exposing the underlying surface of the substrate 102, thereby avoiding any potential need to deposit additional dielectric material 104 as described with reference to FIG. 3.

FIG. 4 illustrates a semiconductor structure 120 that may be formed by bonding a semiconductor material 122 to the substrate 102 of the structure 116 of FIG. 3 by establishing direct dielectric-to-dielectric molecular bonds directly between the dielectric material 104 on the substrate 102 and a dielectric material 104 on the semiconductor material 122 as described herein below. As shown in FIG. 4, a plurality of fluidic microchannels 124 are defined between the dielectric material 104 on the substrate 102 and the dielectric material 104 on the semiconductor material 122 at the interface therebetween. As shown in FIG. 4, the microchannels 124 are at least partially defined by the recesses 106 previously formed in the dielectric material 104 on the substrate 102. Further, the microchannels 124 have cross-sectional shapes shown in FIG. 4 that are entirely surrounded by the dielectric material 104 between the semiconductor material 122 and the substrate 102.

The semiconductor structure 120 shown in FIG. 4 may comprise a semiconductor-on-insulator structure, and may include a layer of semiconductor material 122 bonded over the substrate 102 with an electrically insulating dielectric material 104 between the layer of semiconductor material 122 and the substrate 102. In some embodiments, the layer of semiconductor material 122 and/or the layer of dielectric material 104 may be relatively thin compared to a thickness of the substrate 102. In embodiments in which the semiconductor material 122 comprises silicon, the semiconductor structure 120 shown in FIG. 4 may comprise what is referred to in the art as a silicon-on-insulator structure. The layer of semiconductor material 122 may have an average layer thickness $T_S$ of between about five nanometers (5 nm) and about two and one-half microns (2.5 µm), between about ten nanometers (10 nm) and about one and one-half microns (1.5 µm), or even between about twenty nanometers (20 nm) and about one hundred nanometers (100 nm). The layer of electrically insulating dielectric material 104 may have an average layer thickness $T_D$, which may be relatively thicker than such layers in conventional SOI structures to accommodate the presence of the fluidic microchannels 124 therein. As non-limiting examples, the layer of electrically insulating dielectric material 104 may have an average layer thickness $T_D$ of between about one tenth of one micron (0.1 µm) and about five hundred microns (500 µm), between about one micron (1.0 µm) and about four hundred microns (400 µm), or even between about one hundred microns (100 µm) and about four hundred microns (400 µm). In further embodiments, the layer of electrically insulating dielectric material 104 may have an average layer thickness $T_D$ of about five hundred microns (500 µm) or more, or even about nine hundred microns (900 µm) or more.

The layer of semiconductor material 122 may be provided over the substrate 102 by bonding a separately formed layer of semiconductor material 122 to the dielectric material 104 on the major surface of the substrate 102. In some embodiments, a layer of semiconductor material 122 may be bonded to the substrate 102 by transferring a layer of semiconductor material 122 from a donor structure onto the structure 116 of FIG. 3. By way of example and not limitation, the process known in the art as the SMARTCUT® process may be used to transfer a layer of semiconductor material 122 from a donor structure onto the structure 116 of FIG. 3.

The SMARTCUT® process is described in, for example, U.S. Pat. No. RE39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (issued Sep. 20, 2005), the disclosures of which are incorporated herein in their entireties by this reference.

Figure 5:
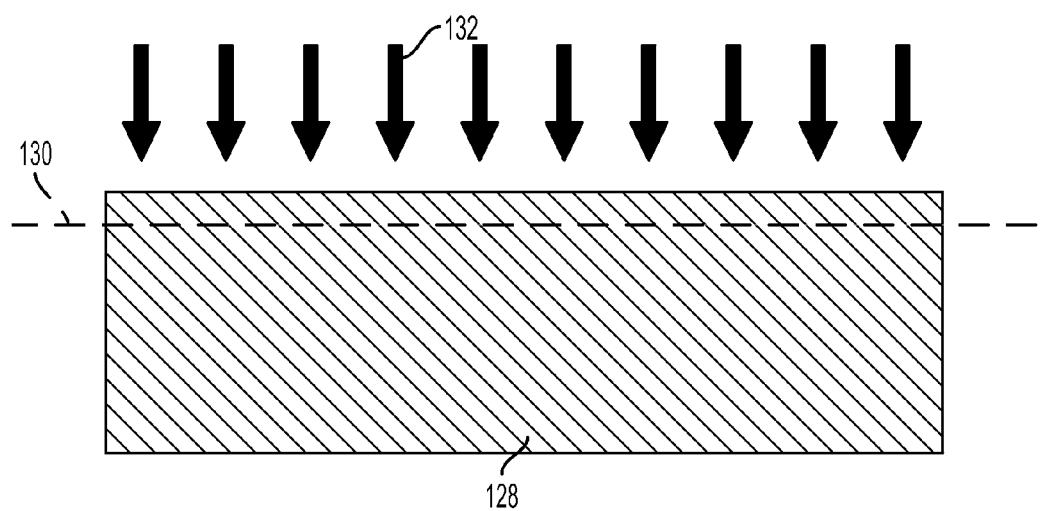
FIGS. 5 through 8 illustrate a method that may be used to provide the layer of semiconductor material shown in FIG. 4 over the structure of FIG. 3.

The SMARTCUT® process is briefly described below with reference to FIGS. 5 through 8. Referring to FIG. 5, a plurality of ions (e.g., one or more of hydrogen, helium, or inert gas ions) may be implanted into a donor structure 128 along an ion implant plane 130. The donor structure 128 may comprise a bulk crystalline semiconductor material, such as monocrystalline silicon. The implantation of ions is represented in FIG. 5 by directional arrows 132. The implanted ions along the ion implant plane 130 define a weakened ion implant plane within the donor structure 128, along which the donor structure 128 subsequently may be cleaved or otherwise fractured. As known in the art, the depth at which the ions are implanted into the donor structure 128 is at least partially a function of the energy with which the ions are implanted into the donor structure 128. Generally, ions implanted with less energy will be implanted at relatively shallower depths, while ions implanted with higher energy will be implanted at relatively deeper depths.

Figure 6:
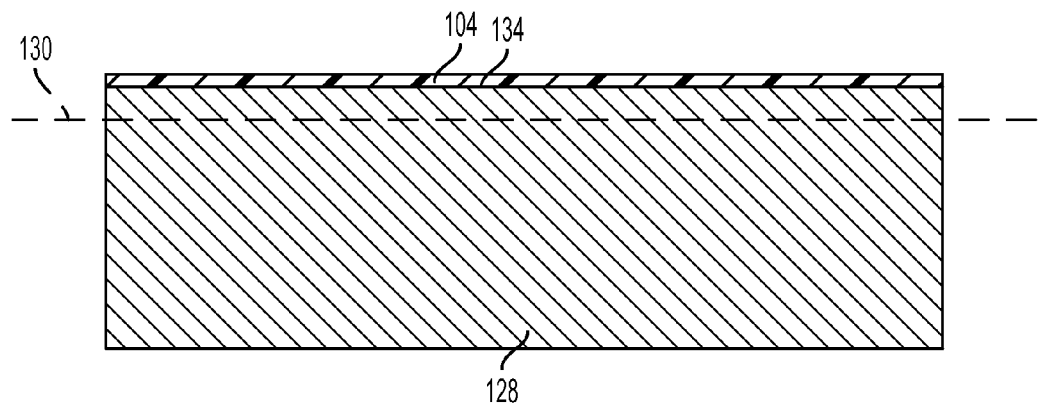

As shown in FIG. 6, a layer of dielectric material 104 may be provided on a surface 134 of the donor structure 128 to be bonded to the structure 116 of FIG. 3. The layer of dielectric material 104 may be provided on the surface 134 before or after implanting ions into the donor structure 128 along the ion implant plane 130 as described above with reference to FIG. 5. The layer of dielectric material 104 may be provided on the surface 134 of the donor structure 128 by, for example, oxidizing the surface 134 of the donor structure 128, or by depositing the dielectric material 104 onto the surface 134 of the donor structure 128 using, for example, a chemical vapor deposition (CVD) process.

Figure 7:
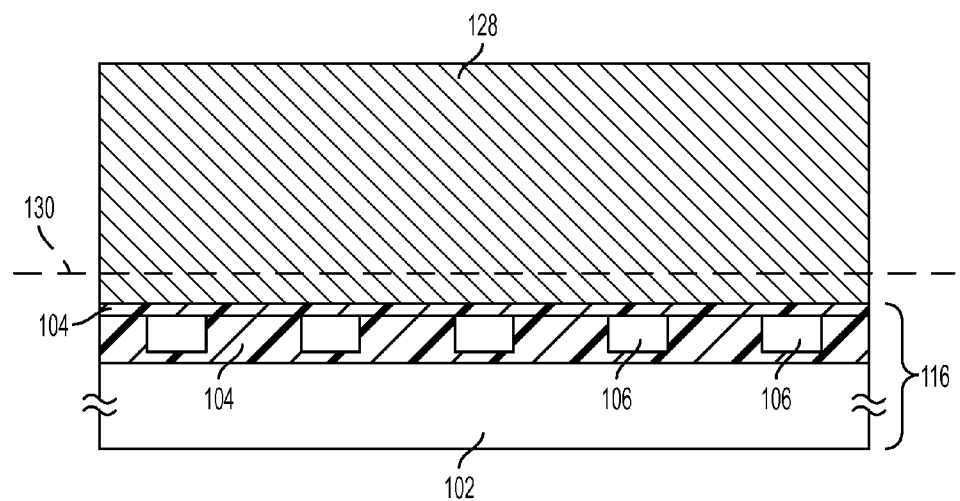

Referring to FIG. 7, the dielectric material 104 on the donor structure 128 is brought into direct physical contact with the dielectric material 104 on the major surface of the substrate 102 of the structure 116 (also shown in FIG. 3). Prior to abutting the surfaces of the dielectric material 104 together, the surfaces may be smoothened and prepared for bonding by, for example, subjecting the surfaces to one or more of a grinding process, an etching process, and a polishing process (e.g., a chemical-mechanical polishing (CMP) process) to reduce a surface roughness of the bonding surfaces. The surfaces of the dielectric material 104 also may be subjected to an annealing process prior to abutting the surfaces together for bonding.

Figure 8:
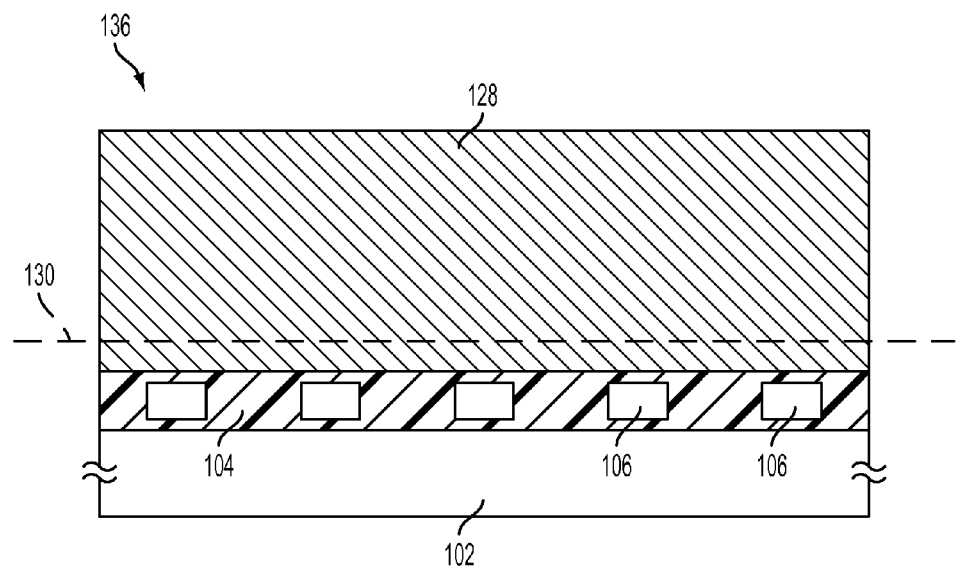

As shown in FIG. 8, after abutting the surfaces of the dielectric material 104 together, direct dielectric-to-dielectric molecular bonds may be established between the dielectric material 104 on the donor structure 128 and the dielectric material 104 on the substrate 102 of the structure 116 to form the bonded structure 136 shown in FIG. 8. Methods for establishing such direct molecular bonds are described in, for example, U.S. Patent Application Publication No. US 2011/0045611 A1, which published Feb. 24, 2011 in the name of Castex et al., the disclosure of which is incorporated herein in its entirety by this reference.

After forming the bonded structure 136 of FIG. 8, the donor structure 128 is cleaved or otherwise fractured along the ion implant plane 130 to form the structure 120 of FIG. 4. For example, the donor structure 128 (with the substrate 102 bonded thereto through the dielectric material 104) may be heated to cause the donor structure 128 to fracture along the ion implant plane 130. Optionally, mechanical forces may be applied to the donor structure 128 to assist in the cleaving of the donor structure 128 along the ion implant plane 130. After the donor structure 128 has been cleaved or otherwise fractured along the ion implant plane 130, a portion of the donor structure 128 remains bonded to the substrate 102 through the dielectric material 104, which portion defines the layer of semiconductor material 122 (FIG. 4). A remainder of the donor structure 128 may be reused in further SMARTCUT® processes to transfer additional portions of the donor structure 128 to additional substrates.

Referring again to FIG. 4, after the fracturing process, an exposed major surface 140 of the layer of semiconductor material 122 comprises a fractured surface of the donor structure 128 (FIG. 8), and may include ion impurities and imperfections in the crystal lattice of the layer of semiconductor material 122. The layer of semiconductor material 122 may be treated in an effort to reduce impurity levels and improve the quality of the crystal lattice (i.e., reduce the number of defects in the crystal lattice proximate the exposed major surface 140) in the layer of semiconductor material 122. Such treatments may involve one or more of grinding, polishing, etching, and thermal annealing.

In other embodiments, the layer of semiconductor material 122 may be provided on the substrate 102 by bonding bulk semiconductor material to the dielectric material 104 on the substrate 102 and subsequently thinning the bulk semiconductor material to the thickness $T_S$ using one or more of a grinding process, a polishing process, and an etching process (e.g., a chemical-mechanical polishing process) to form the layer of semiconductor material 122.

With continued reference to FIG. 4, in the methods described above, the fluidic microchannels 124 are formed within the layer of dielectric material 104 by forming recesses 106 (FIG. 3) only in the dielectric material 104 on the substrate 102 prior to providing the layer of semiconductor material 122 on the dielectric material 104 and the substrate 102. In additional embodiments of methods of the present disclosure, the fluidic microchannels 124 may be formed within the layer of dielectric material 104 by forming recesses in the dielectric material 104 on the semiconductor material 122 (or the donor structure 128 of FIG. 6) prior to providing the layer of semiconductor material 122 on the dielectric material 104 and the substrate 102, or by forming recesses in both the dielectric material 104 on the substrate 102 and the dielectric material 104 on the semiconductor material 122 (or the donor structure 128 of FIG. 6) prior to providing the layer of semiconductor material 122 on the dielectric material 104 and the substrate 102. Examples of such methods are disclosed below with reference to FIGS. 9 and 10.

FIG. 9 is similar to FIG. 6 and illustrates the donor structure 128 having ions implanted therein along the ion implant plane 130, and a dielectric material 104 on the surface 134 of the donor structure 128. As shown in FIG. 9, recesses 142 may be formed in the layer of dielectric material 104 on the donor structure 128. The recesses 142 may be at least substantially similar to the recesses 106 formed in the dielectric material 104 on the substrate 102 (FIG. 3), and may be formed as previously described with reference to the recesses 106 of FIGS. 2A, 2B, and 3. The recesses 142 of FIG. 9, however, may be formed in a pattern that is a mirror image of the recesses 106 of FIG. 3.

FIG. 10 is similar to FIG. 7 and illustrates the dielectric material 104 on the donor structure 128 in direct physical contact with the dielectric material 104 on the major surface of the substrate 102 of the structure 116 (also shown in FIG. 3). As shown in FIG. 10, the recesses 142 in the dielectric material 104 on the donor structure 128 may be aligned with the complementary recesses 106 formed in the dielectric material 104 on the substrate 102. Prior to abutting the surfaces of the dielectric material 104 together, the surfaces may be prepared for bonding as previously described, after which a direct bonding process may be used to establish direct dielectric-to-dielectric molecular bonds between the dielectric material 104 on the donor structure 128 and the dielectric material 104 on the substrate 102, as previously described with reference to FIG. 8.

Thus, one or more laterally extending recesses may be formed in at least one of the dielectric material 104 on the substrate 102 and the dielectric material 104 on the semiconductor material of the donor structure 128 prior to bonding the donor structure 128 to the substrate 102 by establishing dielectric-to-dielectric molecular bonds directly between the dielectric material 104 on the substrate 102 and the dielectric material 104 on the donor structure 128 and defining one or more fluidic microchannels 124 (FIG. 4) between the dielectric materials 104 at the interface therebetween. Further, the fluidic microchannels 124 are partially defined by the recesses 142 in the dielectric material 104 on the donor structure 128 and partially defined by the recesses 106 formed in the dielectric material 104 on the substrate 102.

The semiconductor structure 120 of FIG. 4 includes a single layer of fluidic microchannels 124 that are disposed in a single, common plane and that are at least substantially entirely embedded within and surrounded by the dielectric material 104 between the layer of semiconductor material 122 and the substrate 102. Optionally, additional layers of fluidic microchannels 124 may be formed on the structure 120 of FIG. 4. Some such additional layers of fluidic microchannels 124 may include fluidic microchannels that extend at least partially within the layer of semiconductor material 122. Examples of such methods are disclosed below with reference to FIGS. 11 through 16.

FIG. 11 is substantially similar to FIG. 4 and illustrates the SOI semiconductor structure 120, which includes fluidic microchannels 124 within the dielectric material 104 between the layer of semiconductor material 122 and the substrate 102.

As shown in FIG. 12, one or more laterally extending recesses 148 may be formed in the layer of semiconductor material 122 to form the structure 150 shown therein. The recesses 148 are used to form additional fluidic microchannels. The laterally extending recesses 148 may comprise apertures that extend entirely through the layer of semiconductor material 122 to the underlying dielectric material 104 in some embodiments. The recesses 148 may be generally similar to the recesses 106 previously described with reference to FIGS. 2A and 2B, and may be formed as previously described with reference to the recesses 106 of FIGS. 2A and 2B.

Referring to FIG. 13, dielectric material 104 may be provided over the semiconductor structure 150 of FIG. 12, including within the recesses 148 so as to cover the exposed surfaces of the layer of semiconductor material 122 within the recesses 148 with dielectric material 104, and form the structure 152 of FIG. 13. Again, this may prevent oxidation or other alteration of the surfaces within the recesses 148 and resulting fluidic microchannels when cooling fluid is caused to flow through the fluidic microchannels during operation. In some embodiments, the dielectric material 104 may be similar or identical in composition to the dielectric material 104 between the layer of semiconductor material 122 and the substrate 102. The dielectric material 104 may be formed as previously described herein.

FIG. 14 illustrates a semiconductor structure 154 that may be formed by bonding another semiconductor material 122A over the layer of semiconductor material 122 first provided on the substrate 102 by establishing direct dielectric-to-dielectric molecular bonds directly between the dielectric material 104 provided over the first layer of semiconductor material 122 and a dielectric material 104 on the additional layer of semiconductor material 122A. As shown in FIG. 14, another plurality of fluidic microchannels 124A are defined between the dielectric material 104 on the dielectric material 104 provided over the first layer of semiconductor material 122 and the dielectric material 104 on the additional layer of semiconductor material 122A at the interface therebetween. As shown in FIG. 14, the microchannels 124A are at least partially defined by the recesses 148 previously formed in the first layer of semiconductor material 122. Further, the fluidic microchannels 124A have cross-sectional shapes shown in FIG. 14 that are entirely surrounded by dielectric material 104. The additional layer of semiconductor material 122A may be at least substantially similar to the layer of semiconductor material 122 first provided over the substrate 102, and the additional layer of semiconductor material 122A may be provided on the structure 152 of FIG. 13 to form the structure 154 of FIG. 14 using methods as previously described herein with reference to FIGS. 4 through 10.

The processes described above with reference to FIGS. 12 through 14 may be repeated any number of times, as desirable, to provide any number of layers of fluidic microchannels in a resulting semiconductor structure. For example, FIG. 15 illustrates a semiconductor structure 160 that may be formed by repeating the processes described with reference to FIGS. 12 through 14 two additional times on the structure 154 of FIG. 14. The resulting semiconductor structure 154 includes a third layer of fluidic microchannels 124B formed in the additional layer of semiconductor material 122A, a fourth layer of fluidic microchannels 124C formed in a third layer of semiconductor material 122B, and a fourth layer of semiconductor material 122C provided over the fourth layer of fluidic microchannels 124C in the third layer of semiconductor material 122B.

In additional methods of the present disclosure, fluidic microchannels may be formed in a layer of semiconductor material 122 on an SOI semiconductor structure, as previously described with reference to FIGS. 11 through 14, without first forming fluidic microchannels 124 in the layer of electrically insulating dielectric material 104 between the layer of semiconductor material and the underlying substrate 102, as previously described with reference to FIGS. 1 through 4. Examples of such methods are described below with reference to FIGS. 16 through 20.

FIG. 16 illustrates a semiconductor structure 164 that includes a layer of semiconductor material 122 on a substrate 102 with a layer of dielectric material 104 between the layer of semiconductor material 122 and the substrate 102. The semiconductor structure 164 is generally similar to the structure 120 of FIG. 4, but does not include fluidic microchannels 124 as does the structure 120 of FIG. 4. Further, the layer of dielectric material 104 between the layer of semiconductor material 122 and the substrate 102 may be relatively thinner than the layer of dielectric material 104 of the structure 120 of FIG. 4. The semiconductor structure 164 of FIG. 16, like the structure 120 of FIG. 4, may comprise a semiconductor-on-insulator (SOI) structure.

As shown in FIG. 17, one or more laterally extending recesses 166 may be formed in the layer of semiconductor material 122 to form the structure 168 shown therein. The recesses 166 are used to form fluidic microchannels. The laterally extending recesses 166 may comprise apertures that extend entirely through the layer of semiconductor material 122 to the underlying dielectric material 104 in some embodiments. The recesses 166 may be generally similar to the recesses 106 previously described with reference to FIGS. 2A and 2B and the recesses 148 of FIG. 12, and may be formed as previously described with reference to the recesses 106 of FIGS. 2A and 2B and the recesses 148 of FIG. 12.

Referring to FIG. 18, dielectric material 104 may be provided on surfaces of the semiconductor structure 164 of FIG. 17, including the surfaces of the semiconductor material 122 within the recesses 166 so as to cover the exposed surfaces of the layer of semiconductor material 122 within the recesses 166 with the dielectric material 104, and form the structure 170 of FIG. 18. Again, this may prevent oxidation or other alteration of the surfaces within the recesses 166 and resulting fluidic microchannels when cooling fluid is caused to flow through the fluidic microchannels during operation. In some embodiments, the dielectric material 104 provided over the semiconductor material 122 may be similar or identical in composition to the dielectric material 104 between the layer of semiconductor material 122 and the substrate 102, and may be formed as previously described herein.

FIG. 19 illustrates a semiconductor structure 172 that may be formed by bonding another semiconductor material 122A over the layer of semiconductor material 122 first provided on the substrate 102 by establishing direct dielectric-to-dielectric molecular bonds directly between the dielectric material 104 provided over the first layer of semiconductor material 122 and a dielectric material 104 on the additional layer of semiconductor material 122A. As shown in FIG. 19, a plurality of fluidic microchannels 124A are defined between the dielectric material 104 on the dielectric material 104 provided over the first layer of semiconductor material 122 and the dielectric material 104 on the additional layer of semiconductor material 122A at the interface therebetween. The microchannels 124A are similar to those previously described with reference to FIG. 14, and are at least partially defined by the recesses 166 (FIG. 17) previously formed in the first layer of semiconductor material 122. Further, the fluidic microchannels 124A have cross-sectional shapes shown in FIG. 19 that are entirely surrounded by dielectric material 104. The additional layer of semiconductor material 122A may be at least substantially similar to the layer of semiconductor material 122 first provided over the substrate 102, and the additional layer of semiconductor material 122A may be provided on the structure 170 of FIG. 18 to form the structure 172 of FIG. 19 using methods as previously described herein with reference to FIGS. 4 through 10.

FIG. 20 illustrates a semiconductor structure 174 that may be formed by repeating the processes described with reference to FIGS. 17 through 19 two additional times on the structure 172 of FIG. 19. The resulting semiconductor structure 174 includes a second layer of fluidic microchannels 124B formed in the additional layer of semiconductor material 122A, a third layer of fluidic microchannels 124B formed in a third layer of semiconductor material 122B, and a fourth layer of semiconductor material 122C provided over the third layer of fluidic microchannels 124B in the third layer of semiconductor material 122B.

The semiconductor structures described herein that include fluidic microchannels therein, such as the semiconductor structure 120 of FIG. 4, the semiconductor structure 160 of FIG. 15, the semiconductor structure 172 of FIG. 19, and the semiconductor structure 174 of FIG. 20, may be employed as a heat-sink device for cooling one or more operational semiconductor devices during operation thereof, which may be bonded to, or otherwise structurally coupled with, the semiconductor structures described herein that include fluidic microchannels. As a non-limiting example, FIG. 21 is a simplified illustration depicting an operational electronic device 180 that includes an operational semiconductor device 182 structurally and electrically coupled with a higher level substrate 184. The semiconductor device 182 may comprise, for example, an electronic signal processing device, a memory device, an application specific integrated circuit (ASIC) device, and/or a photoactive device (e.g., a light-emitting diode (LED)). In some embodiments, the semiconductor device 182 may comprise a plurality of 3D integrated operational semiconductor devices. The higher level substrate 184 may comprise, for example, a printed circuit board to which the semiconductor device 182 is structurally and electrically coupled by way of electrical contacts 186. The electronic device 180 further includes the semiconductor structure 160 of FIG. 15 bonded to a surface 188 of the semiconductor device 182. In this configuration, a cooling fluid may be caused to flow through the fluidic microchannels 124, 124A, 124B, 124C within the semiconductor structure 160 during operation of the semiconductor device 182 so as to draw heat that is generated within the semiconductor device 182 out from, and away from, the semiconductor device 182 through the cooling fluid circulating or otherwise flowing through the fluidic microchannels 124, 124A, 124B, 124C within the semiconductor structure 160.

In addition or as an alternative to being used as a separate heat sink device as described with reference to FIG. 21, the semiconductor structures described herein that include fluidic microchannels therein (such as the semiconductor structure 120 of FIG. 4, the semiconductor structure 160 of FIG. 15, the semiconductor structure 172 of FIG. 19, and the semiconductor structure 174 of FIG. 20) may be employed as integral cooling SOI substrates on and/or in which operational semiconductor devices may be fabricated in subsequent processes. Such operational semiconductor devices may include, for example, one or more of an electronic signal processing device, a memory device, an application specific integrated circuit (ASIC) device, and/or a photoactive device (e.g., a light-emitting diode (LED), a solar cell, etc.). Examples of methods that may be used to fabricate such integral semiconductor devices on and/or in the SOI semiconductor structures that include fluidic microchannels therein are described below with reference to FIGS. 22 through 26.

FIG. 22 illustrates another semiconductor structure 190 that includes a layer of semiconductor material 122 on a substrate 102 with a layer of dielectric material 104 between the layer of semiconductor material 122 and the substrate 102. Fluidic microchannels 124 extend through the layer of dielectric material 104 between the layer of semiconductor material 122 and the substrate 102. Thus, the semiconductor structure 190 is generally similar to the structure 120 of FIG. 4 and comprises a semiconductor-on-insulator (SOI) structure. The semiconductor structure 190 of FIG. 22, however, further includes conductive vias 192 that extend vertically through the semiconductor structure 190 (from the perspective of FIG. 22). As shown in FIG. 22, the conductive vias 192 may extend from an exposed major surface 140 of the layer of semiconductor material 122 entirely through the layer of semiconductor material 122 and the layer of dielectric material 104, and at least partially through the substrate 102. In some embodiments, the conductive vias 192 may extend only partially through the substrate 102 as shown in FIG. 22. Methods that may be used to provide the conductive vias 192 within the structure 190 of FIG. 22 are subsequently described herein with reference to FIGS. 27 through 40.

Referring to FIG. 23, one or more active layers 194 that include active semiconductor device structures, such as, for example, transistors or other devices including PN junctions may be formed on and/or in the layer of semiconductor material 122 on a side thereof opposite the dielectric material 104 to form the structure 196 of FIG. 23. Such active layers 194 may further include electrically conductive features for interconnecting operational components of such active semiconductor device structures. Such conductive features may include, for example, vertically extending conductive vias, laterally extending conductive traces, conductive contact pads, etc. Stated another way, one or more of an electronic signal processing device, a memory device, an application specific integrated circuit (ASIC) device, and/or a photoactive device (e.g., a light-emitting diode (LED), a solar cell, etc.) may be formed on the structure 190 of FIG. 22 utilizing the layer of semiconductor material 122.

As shown in FIG. 24, the substrate 102 then may be thinned by removing material of the substrate 102 from the exposed major surface 198 on a side of the substrate 102 opposite the layer of dielectric material 104 to expose ends 200 of the conductive vias 192 within the substrate 102 and form the structure 202 of FIG. 24. The substrate 102 may be thinned using, for example, one or more of an etching process, a grinding process, and a polishing process (e.g., a chemical-mechanical polishing (CMP) process). If needed to facilitate the thinning process, a carrier substrate may be temporarily attached to the structure 196 of FIG. 23 on a side thereof opposite the surface 198 of the substrate 102 to facilitate gripping and handling of the structure 196 during the thinning process by processing equipment. Such a carrier substrate then may be removed after the thinning process.

Although not illustrated in the figures, the structure 202 of FIG. 24 may be subjected to what are referred to in the art as "packaging" processes, wherein one or more surfaces of the structure 202 may be covered with an inert and electrically insulating material (e.g., a ceramic material, a polymer material, etc.). Such packaging processes may be used to pacify, cover, and protect the materials and devices of the semiconductor structure 202.

As shown in FIG. 25, electrical contacts 204 may be formed on the exposed ends 200 of the conductive vias 192 to form the structure 206 of FIG. 25. If the structure 202 of FIG. 24 was subjected to a packaging process, the ends 200 of the conductive vias 192 may need to be exposed by etching or otherwise removing any packaging material over the ends 200 of the conductive vias 192. The electrical contacts 204 may comprise any of a number of different known configurations of electrical contacts. As a non-limiting example, the electrical contacts 204 may comprise balls or bumps of an electrically conductive solder material that can be "reflowed" to allow the electrical contacts 204 to be structurally and electrically coupled with contact pads of another semiconductor device or a higher level substrate in a subsequent process.

As a non-limiting example, FIG. 26 illustrates a 3D integrated bonded semiconductor structure 210 that includes two semiconductor structures 206 like that illustrated in FIG. 25, wherein the electrical contacts 204 of one of the semiconductor structures 206 (the upper semiconductor structure 206 from the perspective of FIG. 26) have been structurally and electrically coupled with exposed ends of conductive vias 192 extending through the other of the semiconductor structures 206 (the lower semiconductor structure 206 from the perspective of FIG. 26). In further embodiments, the two semiconductor structures 206 may be directly bonded to one another without the need for intermediate electrical contacts 204, such that the substrate 102 (of upper semiconductor structure 206) is directly bonded to the active layer 194 (of the lower semiconductor structure 206), in such a manner as to provide electrical contact between the upper conductive vias 192 and the lower conductive vias 192.

During operation of the integral semiconductor devices in the active layers 194 of the semiconductor structures 206, a cooling fluid may be caused to flow through the fluidic microchannels 124 within the semiconductor structures 206 during operation of the 3D integrated bonded semiconductor structure 210 so as to draw heat that is generated within the active layers 194 out from, and away from, the semiconductor structure 210 through the cooling fluid circulating or otherwise flowing through the fluidic microchannels 124 therein.

FIGS. 27 through 33 illustrate examples of methods that may be used to form a structure 190 like that of FIG. 22, which includes conductive vias 192 therein.

Referring to FIG. 27, a layer of dielectric material 104 may be provided on a substrate 102 (to form a structure 100 as shown in FIG. 1), after which holes 212 may be formed through the layer of dielectric material 104 and partially through the substrate 102 from an exposed surface 214 of the dielectric material 104 on a side thereof opposite the substrate 102. The holes 212 may be formed through the dielectric material 104 and into the substrate 102 using, for example, a photolithographic masking and etching process. In such embodiments, a mask layer may be deposited over the surface 214 of the dielectric material 104 and selectively patterned so as to form apertures through the mask layer at the locations at which it is desired to etch into the dielectric material 104 and the substrate 102 to form the holes 212. After forming the patterned mask layer, the regions of the dielectric material 104 (and ultimately the substrate 102) that are exposed through the patterned mask layer may be etched using, for example, a wet etching process or a dry reactive ion etching process to form the holes 212 through the dielectric material 104 and into the substrate 102. The holes may have any cross-sectional shape, such as a generally circular or a generally rectangular cross-sectional shape. After the etching process, the patterned mask layer may be removed.

As shown in FIG. 28, one or more laterally extending recesses 106 that will ultimately be used to form fluidic microchannels 124 (FIG. 22) may be formed in the dielectric material 104 on the substrate 102 to form the structure 216 shown in FIG. 28. The recesses 106 may comprise recesses 106 as previously described with reference to FIGS. 2A and 2B, and may be formed using the methods disclosed with reference to FIGS. 2A and 2B.

Referring to FIG. 29, additional dielectric material 104 may be provided over the semiconductor structure 216 of FIG. 28, including within the recesses 106 and within the holes 212 so as to cover the exposed surfaces of the substrate 102 within the recesses 106 and holes 212 with dielectric material 104 and form the structure 218 of FIG. 29.

Referring to FIG. 30, a donor structure 128, which may include ions implanted therein along an ion implant plane 130, and which may be formed as previously described with reference to FIGS. 5 and 6, may be bonded over the substrate 102 as previously described herein with reference to FIGS. 7 and 8. In particular, a dielectric material 104 on the donor structure 128 may be brought into direct physical contact with the dielectric material 104 on the substrate 102, and direct dielectric-to-dielectric molecular bonds may be established between the dielectric material 104 on the donor structure 128 and the dielectric material 104 on the substrate 102 to foam the bonded structure 220 shown in FIG. 30.

After forming the bonded structure 220 of FIG. 30, the donor structure 128 is cleaved or otherwise fractured along the ion implant plane 130 as previously described herein to form the structure 222 of FIG. 31, which includes a layer of semiconductor material 122 bonded over the substrate 102 (with the dielectric material 104 therebetween) and transferred from the donor structure 128 (FIG. 30). As shown in FIG. 31, the holes 212 may be buried within the structure 222, and may not extend through the layer of semiconductor material 122. In other words, the holes 212 may not communicate with the exterior of the structure 222.

Thus, referring to FIG. 32, additional holes 224 may be etched or otherwise formed through the layer of semiconductor material 122 at the locations vertically above (from the perspective of FIG. 32) the holes 212 so as to extend the holes 212 through the layer of semiconductor material 122. The additional holes 224 may be formed through the layer of semiconductor material 122 using processes previously described for forming the holes 212.

After extending the holes 212 through the layer of semiconductor material 122 as described with reference to FIG. 32, a conductive material 228 may be provided within the holes 212 to complete formation of the conductive vias 192 and form the structure 226 shown in FIG. 33, which is at least substantially similar to the structure 190 of FIG. 22. The conductive material 228 may comprise, for example, one or more metals or metal alloys. The conductive material 228 may be deposited within the holes 212 using one or more of a deposition process (e.g., a physical vapor deposition process (PVD) or a chemical vapor deposition (CVD) process), an electroless plating process, and an electrolytic plating process.

In the methods described above with reference to FIGS. 27 through 33, the holes 212 are not filled with conductive material 228 until the holes 212 have been extended through the layer of semiconductor material 122 as described with reference to FIG. 32. In additional methods, a portion of the holes 212 may be filled with conductive material 228 prior to extending the holes 212 through the layer of semiconductor material 122. Examples of such methods are described below with reference to FIGS. 34 through 40.

Referring to FIG. 34, a layer of dielectric material 104 may be provided on a substrate 102 (to form a structure 100 as shown in FIG. 1), after which holes 212 may be formed through the layer of dielectric material 104 and partially through the substrate 102 from an exposed surface 214 of the dielectric material 104 on a side thereof opposite the substrate 102. The holes 212 may be formed as previously described. After forming the holes 212, a layer of dielectric material 104 optionally may be deposited on exposed surfaces within the holes 212, or exposed surfaces within the holes 212 may be oxidized as needed or desirable. After forming the holes 212, the holes 212 may be filled with conductive material 228 to complete formation of lower sections (from the perspectives of the figures) of the conductive vias 192 (FIG. 22) to be formed therein, and form the structure 230 shown in FIG. 34.

As shown in FIG. 35, one or more laterally extending recesses 106 that will ultimately be used to form fluidic microchannels 124 (FIG. 22) may be formed in the dielectric material 104 on the substrate 102 to form the structure 232 shown in FIG. 35. The recesses 106 may comprise recesses 106 as previously described with reference to FIGS. 2A and 2B, and may be formed using the methods disclosed with reference to FIGS. 2A and 2B.

Referring to FIG. 36, additional dielectric material 104 may be provided over the semiconductor structure 232 of FIG. 35, including within the recesses 106 so as to cover the exposed surfaces of the substrate 102 within the recesses 106 with dielectric material 104 and form the structure 234 of FIG. 36.

Referring to FIG. 37, a donor structure 128, which may include ions implanted therein along an ion implant plane 130, and which may be formed as previously described with reference to FIGS. 5 and 6, may be bonded over the substrate 102 as previously described herein with reference to FIGS. 7 and 8. In particular, a dielectric material 104 on the donor structure 128 may be brought into direct physical contact with the dielectric material 104 on the substrate 102, and direct dielectric-to-dielectric molecular bonds may be established between the dielectric material 104 on the donor structure 128 and the dielectric material 104 on the substrate 102 to form the bonded structure 236 shown in FIG. 37.

After forming the bonded structure 236 of FIG. 37, the donor structure 128 is cleaved or otherwise fractured along the ion implant plane 130 as previously described herein to form the structure 238 of FIG. 38, which includes a layer of semiconductor material 122 bonded over the substrate 102 (with the dielectric material 104 therebetween) and transferred from the donor structure 128 (FIG. 37). As shown in FIG. 38, the sections of the conductive vias 192 (FIG. 22) defined by the conductive material 228 within the holes 212 may be buried within the structure 238, and may not extend through the layer of semiconductor material 122.

Thus, referring to FIG. 39, additional holes 224 may be etched or otherwise formed through the layer of semiconductor material 122 at the locations vertically above (from the perspective of FIG. 39) the holes 212 and the conductive material 228 therein so as to extend the holes 212 through the layer of semiconductor material 122. The additional holes 224 may be formed through the layer of semiconductor material 122 using processes previously described for formation of the holes 212.

After forming the additional holes 224 to extend the holes 212 through the layer of semiconductor material 122, additional conductive material 228 may be provided within the holes 224 to complete formation of the conductive vias 192 and form the structure 240 shown in FIG. 40, which is at least substantially similar to the structure 190 of FIG. 22.

Additional non-limiting example embodiments of the present disclosure are set forth below.

Embodiment 1

A method of fabricating a semiconductor structure, comprising: forming at least one laterally extending recess in at least one of a first dielectric material on a substrate and a second dielectric material on a semiconductor material; and bonding the semiconductor material to the substrate by establishing dielectric-to-dielectric molecular bonds directly between the first dielectric material on the substrate and the second dielectric material on the semiconductor material and defining at least one fluidic microchannel between the first dielectric material and the second dielectric material at an interface between the first dielectric material and the second dielectric material, the at least one fluidic microchannel at least partially defined by the at least one laterally extending recess and including at least one laterally extending section having a transverse cross-sectional shape entirely surrounded by the first dielectric material and the second dielectric material.

Embodiment 2

The method of Embodiment 1, further comprising selecting each of the first dielectric material and the second dielectric material to comprise an oxide.

Embodiment 3

The method of Embodiment 2, further comprising selecting each of the first dielectric material and the second dielectric material to comprise silicon oxide.

Embodiment 4

The method of any one of Embodiments 1 through 3, wherein forming the at least one laterally extending recess in at least one of the first dielectric material on the substrate and the second dielectric material on the semiconductor material comprises forming a first laterally extending recess in the first dielectric material and a second laterally extending recess in the second dielectric material, and wherein bonding the semiconductor material to the substrate comprises aligning the first laterally extending recess with the second laterally extending recess such that the at least one fluidic microchannel is at least partially defined by each of the first laterally extending recess and the second laterally extending recess.

Embodiment 5

The method of any one of Embodiments 1 through 4, further comprising selecting the semiconductor material to comprise a layer of semiconductor material.

Embodiment 6

The method of Embodiment 5, wherein bonding the semiconductor material to the substrate comprises transferring the layer of semiconductor material from a donor structure to the substrate.

Embodiment 7

The method of Embodiment 6, wherein transferring the layer of semiconductor material from the donor structure to the substrate comprises: implanting ions into the donor structure to form a weakened ion implant plane therein; bonding the donor structure over the substrate; and fracturing the donor structure along the weakened ion implant plane to separate the layer of semiconductor material from a remainder of the donor structure.

Embodiment 8

The method of any one of Embodiments 5 through 7, further comprising: forming at least one laterally extending recess in the layer of semiconductor material; lining the at least one laterally extending recess with a third dielectric material; and bonding another semiconductor material to the layer of semiconductor material by establishing dielectric-to-dielectric molecular bonds directly between the third dielectric material and a fourth dielectric material on the another semiconductor material and defining at least one additional fluidic microchannel between the third dielectric material and the fourth dielectric material at an interface between the third dielectric material and the fourth dielectric material, the at least one additional fluidic microchannel at least partially defined by the at least one laterally extending recess formed in the layer of semiconductor material.

Embodiment 9

The method of Embodiment 8, further comprising forming the at least one additional fluidic microchannel to include at least one laterally extending section having a transverse cross-sectional shape entirely surrounded by the third dielectric material and the fourth dielectric material.

Embodiment 10

The method of any one of Embodiments 1 through 9, further comprising selecting the semiconductor material to comprise silicon.

Embodiment 11

The method of any one of Embodiments 1 through 10, further comprising providing a fluid within the at least one fluidic microchannel.

Embodiment 12

The method of Embodiment 11, further comprising providing a liquid within the at least one fluidic microchannel.

Embodiment 13

The method of any one of Embodiments 1 through 12, further comprising forming at least one vertically oriented electrically conductive via extending through the first dielectric material and the second dielectric material.

Embodiment 14

A semiconductor structure, comprising: a semiconductor material bonded to a substrate with a layer of dielectric material between the semiconductor material and the substrate; and at least one fluidic microchannel extending in a lateral direction through the layer of dielectric material between the semiconductor material and the substrate, the at least one fluidic microchannel including at least one laterally extending section having a transverse cross-sectional shape entirely surrounded by the layer of dielectric material.

Embodiment 15

The semiconductor structure of Embodiment 14, wherein the layer of dielectric material comprises a first dielectric material on the substrate and a second dielectric material on the semiconductor material, the semiconductor material being bonded to the substrate by direct dielectric-to-dielectric molecular bonds between the first dielectric material on the substrate and the second dielectric material on the semiconductor material.

Embodiment 16

The semiconductor structure of Embodiment 15, wherein the at least one fluidic microchannel is at least partially defined by at least one laterally extending recess in at least one of the first dielectric material and the second dielectric material.

Embodiment 17

The semiconductor structure of Embodiment 16, wherein the at least one fluidic microchannel is at least partially defined by a first laterally extending recess in the first dielectric material and a second laterally extending recess in the second dielectric material.

Embodiment 18

The semiconductor structure of any one of Embodiments 14 through 17, wherein the layer of dielectric material comprises an oxide.

Embodiment 19

The semiconductor structure of Embodiment 18, wherein the layer of dielectric material comprises silicon oxide.

Embodiment 20

The semiconductor structure of any one of Embodiments 14 through 19, wherein the layer of dielectric material has an average layer thickness in a range extending from about one tenth of a micron (0.1 µm) to about five hundred microns (500 µm).

Embodiment 21

The semiconductor structure of any one of Embodiments 14 through 20, wherein the semiconductor material comprises a layer of semiconductor material.

Embodiment 22

The semiconductor structure of Embodiment 21, wherein the layer of semiconductor material has an average layer thickness in a range extending from about ten nanometers (10 nm) to about one and one-half microns (1.5 µm).

Embodiment 23

The semiconductor structure of Embodiment 21 or Embodiment 22, further comprising: at least one laterally extending recess in the layer of semiconductor material; another semiconductor material bonded over the layer of semiconductor material; another dielectric material disposed between the layer of semiconductor material and the another semiconductor material and lining the at least one laterally extending recess in the layer of semiconductor material; and at least one additional fluidic microchannel extending through the at least one laterally extending recess in the layer of semiconductor material within the another dielectric material.

Embodiment 24

The semiconductor structure of Embodiment 23, wherein the at least one additional fluidic microchannel includes at least one laterally extending section having a transverse cross-sectional shape entirely surrounded by the another dielectric material.

Embodiment 25

The semiconductor structure of any one of Embodiments 14 through 24, wherein the semiconductor material comprises silicon.

Embodiment 26

The semiconductor structure of any one of Embodiments 14 through 25, further comprising a fluid within the at least one fluidic microchannel.

Embodiment 27

The semiconductor structure of Embodiment 24, further comprising a liquid within the at least one fluidic microchannel.

Embodiment 28

The semiconductor structure of any one of Embodiments 14 through 27, wherein the semiconductor structure is configured as a heat sink for attachment to a semiconductor device.

Embodiment 29

The semiconductor structure of any one of Embodiments 14 through 27, wherein the semiconductor structure comprises a substrate on which at least a portion of a semiconductor device is fabricated.

Embodiment 30

The semiconductor structure of any one of Embodiments 14 through 29, further comprising at least one vertically oriented electrically conductive via extending through the layer of dielectric material.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternative useful combinations of the elements described, will become apparent to those skilled in the art from the description. Such modifications and embodiments are also intended to fall within the scope of the appended claims.

What is claimed is:

1. A semiconductor structure, comprising:
   a substrate;
   a first layer of dielectric oxide material disposed over the substrate;
   a first layer of semiconductor material disposed over the first layer of dielectric oxide material, the first layer of dielectric oxide material disposed between the first layer of semiconductor material and the substrate, the first layer of semiconductor material having at least one laterally extending recess in a surface of the first layer of semiconductor material on a side thereof opposite the first layer of dielectric oxide material;
   at least one fluidic microchannel extending in a lateral direction through the first layer of dielectric oxide material between the first layer of semiconductor material and the substrate, the at least one fluidic microchannel including at least one laterally extending section having a transverse cross-sectional shape entirely surrounded by the first layer of dielectric oxide material;
   a second layer of semiconductor material bonded over the first layer of semiconductor material;
   another dielectric material disposed between the first layer of semiconductor material and the second layer of semiconductor material and lining the at least one laterally extending recess in the first layer of semiconductor material; and
   at least one additional fluidic microchannel extending through the at least one laterally extending recess in the first layer of semiconductor material within the another dielectric material.

2. The semiconductor structure of claim 1, wherein the first layer of dielectric oxide material comprises a first dielectric oxide material on the substrate and a second dielectric oxide material on the first layer of semiconductor material, the first layer of semiconductor material being bonded to the substrate by direct oxide-to-oxide molecular bonds between the first dielectric oxide material on the substrate and the second dielectric oxide material on the first layer of semiconductor material.

3. The semiconductor structure of claim 2, wherein the at least one fluidic microchannel is at least partially defined by at least one laterally extending recess in at least one of the first dielectric oxide material and the second dielectric oxide material.

4. The semiconductor structure of claim 3, wherein the at least one fluidic microchannel is at least partially defined by a first laterally extending recess in the first dielectric oxide material and a second laterally extending recess in the second dielectric oxide material.

5. The semiconductor structure of claim 1, wherein the first layer of dielectric oxide material comprises silicon oxide.

6. The semiconductor structure of claim 1, wherein the first layer of semiconductor material has an average layer thickness in a range extending from about ten nanometers (10 nm) to about one and one-half microns (1.5 μm).

7. The semiconductor structure of claim 6, wherein the first layer of dielectric oxide material has an average layer thickness in a range extending from about one tenth of a micron (0.1 μm) to about five hundred microns (500 μm).

8. The semiconductor structure of claim 1, wherein the at least one additional fluidic microchannel includes at least one laterally extending section having a transverse cross-sectional shape entirely surrounded by the another dielectric material.

9. The semiconductor structure of claim 1, wherein the semiconductor material of the first layer of semiconductor material comprises silicon.

10. The semiconductor structure of claim 1, further comprising a fluid within the at least one fluidic microchannel.

11. The semiconductor structure of claim 10, further comprising a liquid within the at least one fluidic microchannel.

12. The semiconductor structure of claim 1, wherein the semiconductor structure is configured as a heat sink for attachment to a semiconductor device.

13. The semiconductor structure of claim 1, wherein the semiconductor structure comprises a cooling substrate on which at least a portion of a semiconductor device is fabricated.

14. The semiconductor structure of claim 1, further comprising at least one vertically oriented electrically conductive via extending through the first layer of dielectric oxide material.

15. The semiconductor structure of claim 1, further comprising an oxide-to-oxide direct molecular bonding interface within the first layer of dielectric oxide material between the first layer of semiconductor material and the substrate.

16. The semiconductor structure of claim 7, wherein the semiconductor structure comprises a semiconductor-on-insulator (SOI) structure.

17. The semiconductor structure of claim 1, further comprising an operational semiconductor device located such that a cooling fluid caused to flow through the at least one fluidic microchannel cools the operational semiconductor device during operation thereof.

18. The semiconductor structure of claim 1, wherein the substrate comprises a die or wafer.

19. The semiconductor structure of claim 1, further comprising a direct molecular bonding interface within the another dielectric material disposed between the first layer of semiconductor material and the second layer of semiconductor material.

* * * * *